United States Patent
Yaoi et al.

(10) Patent No.: US 7,079,421 B2
(45) Date of Patent: Jul. 18, 2006

(54) METHOD OF IMPROVING DATA RETENTION ABILITY OF SEMICONDUCTOR MEMORY DEVICE, AND SEMICONDUCTOR MEMORY DEVICE

(75) Inventors: Yoshifumi Yaoi, Yamatokooriyama (JP); Hiroshi Iwata, Ikoma-gun (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 230 days.

(21) Appl. No.: 10/848,313

(22) Filed: May 19, 2004

(65) Prior Publication Data
US 2004/0233718 A1 Nov. 25, 2004

(30) Foreign Application Priority Data
May 20, 2003 (JP) ............................ 2003-142202

(51) Int. Cl.
*G11C 11/34* (2006.01)
(52) U.S. Cl. .............................. 365/185.24; 365/185.28
(58) Field of Classification Search ........... 365/185.24, 365/185.28, 185.03
See application file for complete search history.

(56) References Cited

U.S. PATENT DOCUMENTS 5,835,413 A  11/1998  Hurter et al. .......... 365/185.24
6,317,364 B1 * 11/2001 Guterman et al. ...... 365/185.28
6,344,994 B1 *  2/2002 Hamilton et al. ...... 365/185.05
6,756,268 B1 *  6/2004 Rudeck et al. ............ 438/257

FOREIGN PATENT DOCUMENTS

| JP | 5-81072 B2 | 11/1993 |
|---|---|---|
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 8/2001 |
| JP | 2001-512290 A | 8/2001 |
| WO | WO 99/07000 A2 | 2/1999 |

* cited by examiner

*Primary Examiner*—Vu A. Le
(74) *Attorney, Agent, or Firm*—Birch, Stewart, Kolasch & Birch, LLP

(57) ABSTRACT

This invention is a method of improving a data retention ability of a semiconductor memory device having a plurality of nonvolatile memory cells storing a plurality of memory states. The method includes the steps of: (a) selecting the nonvolatile memory cells in a first memory group each of which accumulates charges higher in level than a first threshold from the plurality of nonvolatile memory cells; (b) extracting the nonvolatile memory cells in a first sub-group each of which accumulates the charges lower in level than a second threshold from the nonvolatile memory cells in the first memory group; and (c) programming the nonvolatile memory cells in the first sub-group until each of the nonvolatile memory cells accumulates the charges higher in level than the second threshold.

26 Claims, 20 Drawing Sheets

METHOD OF IMPROVING DATA RETENTION ABILITY OF SEMICONDUCTOR MEMORY DEVICE, AND SEMICONDUCTOR MEMORY DEVICE

CROSS-REFERENCE TO RELATED APPLICATION

This application is related to Japanese patent application No. 2003-142202 filed on May 20, 2003, whose priority is claimed under 35 USC § 119, the disclosure of which is incorporated by reference in its entirety.

BACKGROUND OF THE INVENTION

1. Field of the Invention

The present invention relates to a method of improving a data retention ability of a semiconductor memory device that includes nonvolatile memory cells, and a semiconductor memory device. More specifically, the present invention relates to a semiconductor memory device in which nonvolatile semiconductor memory cells, each including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having the function of retaining charges, are arranged, a method of improving a data retention ability of the semiconductor memory device including the nonvolatile memory cells, and a portable electronic apparatus.

2. Description of the Related Art

Conventionally, a flash memory has been typically used as a nonvolatile memory.

As shown in FIG. 22, in such a flash memory, a floating gate 902, an insulating film 907 and a word line (control gate) 903 are formed in this order on a semiconductor substrate 901 via a gate insulating film. On both sides of the floating gate 902, a source line 904 and a bit line 905 are formed in diffusion regions, thereby forming a memory cell. Around the memory cell, a device isolation region 906 is formed (see, for example, Japanese Unexamined Patent Publication No. Hei 5-304277 (1993)).

The memory cell retains data according to a charge amount in the floating gate 902. In a memory cell array constructed by arranging memory cells, by selecting a specific word line and a specific bit line and applying a predetermined voltage, an operation of rewriting/reading a desired memory cell can be performed.

In such a flash memory, when a charge amount in the floating gate changes, a drain current (Id)-gate voltage (Vg) characteristic as shown in FIG. 23 is displayed. In FIG. 23, a solid line shows the characteristics in a writing state while a dashed line shows the characteristics in an erasing state. When the amount of negative charges in the floating gate increases, the threshold increases, and an Id-Vg curve shifts almost in parallel in the direction of increasing Vg.

However, in the above-described flash memory, it has been functionally necessary to dispose the insulating film 907 for separating the floating gate 902 and the word line 903 from each other, and further, it has been difficult to reduce the thickness of the gate insulating film in order to prevent any leakage of charges from the floating gate 902. As a consequence, it has been difficult to effectively reduce the thickness of each of the insulating film 907 and the gate insulating film, thereby inhibiting the microfabrication of the memory cell.

SUMMARY OF THE INVENTION

Various embodiments of present invention provide a semiconductor memory device, which can be easily fined, and a portable electronic apparatus.

Also provided is a method of improving a data retention ability by monitoring and determining a charge level of each nonvolatile memory cell so as to prevent occurrence of an operational defect due to leakage of charges accumulated in each nonvolatile memory cell to cause the charge level of each cell to be equal to or less than a predetermined charge level.

An embodiment of present invention provides a method of improving a data retention ability of a semiconductor memory device having a plurality of nonvolatile memory cells storing a plurality of memory states, the method including the steps of: (a) selecting the nonvolatile memory cells in a first memory group each of which accumulates charges higher in level than a first threshold from the plurality of nonvolatile memory cells; (b) extracting the nonvolatile memory cells in a first sub-group each of which accumulates the charges lower in level than a second threshold from the nonvolatile memory cells in the first memory group; and (c) programming the nonvolatile memory cells in the first sub-group until each of the nonvolatile memory cells accumulates the charges higher in level than the second threshold, wherein each of the nonvolatile memory cells includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

According to an embodiment of the present invention, the level of the charges accumulated in each memory cell is monitored and determined, and the program comprising the predetermined steps is repeatedly performed. Therefore, the data retention ability of the nonvolatile memory cell can be improved. Accordingly, a semiconductor memory device strong against charge leakage and excellent in data retention characteristics can be provided.

In this method, the steps (a) to (c) may be executed based on a command written to the semiconductor memory device.

Alternatively, the steps (a) to (c) may be executed based on a signal inputted to a pin included in the semiconductor memory device.

Further, the first threshold may correspond to a potential level obtained by adding a guard band level to an erasure cell reference level.

In addition to the above steps (a) to (c), the method may further include the steps of: (d) selecting the nonvolatile memory cells in a second memory group each of which accumulates the charges higher in level than a third threshold; (e) extracting the nonvolatile memory cells in a second sub-group each of which accumulates the charges lower in level than a fourth threshold from the nonvolatile memory cells in the second memory group; and (f) programming the nonvolatile memory cells in the second sub-group until each of the nonvolatile memory cells accumulates the charges higher in level than the fourth threshold. Herein, the third threshold is higher than the second threshold, and the fourth threshold is higher than the third threshold.

Alternatively, in addition to the above steps (a) to (c), the method may further include the step of: (d) selecting the nonvolatile memory cells in a second memory group each of which accumulates the charges higher in level than a third threshold; (e) extracting the nonvolatile memory cells in a second sub-group each of which accumulates the charges lower in level than a fourth threshold from the nonvolatile memory cells in the second memory group; and (f) programming the nonvolatile memory cells in the second sub-group until each of the nonvolatile memory cells accumulates the charges higher in level than the fourth threshold. Herein, the fourth threshold is lower than the first threshold, and the third threshold is lower than the fourth threshold.

Also provided is a method of improving a data retention ability of a semiconductor memory device having a plurality of nonvolatile memory cells storing a plurality of memory states, the method comprising the steps of, in the case where a plurality of nonvolatile memory cells including the nonvolatile memory cells in an erasing state each of which accumulates charges lower in level than a predetermined erasure reference level and the nonvolatile memory cells in a programming state each of which accumulates the charges higher in level than a predetermined program reference level are present: (a) selecting the nonvolatile memory cells each of which accumulates the charges higher than the erasure reference level and lower than the program reference level from the plurality of nonvolatile memory cells; and (b) programming the selected nonvolatile memory cells until each of the nonvolatile memory cells accumulates the charges higher than the program reference level, wherein each of the nonvolatile memory cells includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

Herein, in the step (a) of selecting the nonvolatile memory cells each of which accumulates the charges higher than the erasure reference level and lower than the program reference level, only the nonvolatile memory cells higher than a level obtained by adding a guard band level to the erasure reference level may be selected, and the guard band level may be between 300 mV and 500 mV.

Also provided is a method of improving a data retention ability of a semiconductor memory device having a plurality of nonvolatile memory cells storing a plurality of memory states, the method comprising the steps of, in the case where a plurality of nonvolatile memory cells including the nonvolatile memory cells in an erasing state each of which accumulates charges lower in level than a predetermined erasure reference level and the nonvolatile memory cells in a programming state each of which accumulates the charges higher in level than a predetermined program reference level are present: (a) reading first data from a certain nonvolatile memory cell group using a reference voltage level corresponding to the program reference level; (b) reading second data from the nonvolatile memory cell group using a reference voltage level corresponding to a level obtained by adding a guard band level to the erasure reference level; (c) comparing the first data obtained in the step (a) with the second data obtained in the step (b); and (d) programming at least one nonvolatile memory cell group corresponding to a difference between the first data and the second data, wherein each of the nonvolatile memory cells includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

Herein, the step (b) may be executed before the step (a).

Various embodiments of the present invention also provide a semiconductor memory device including a pin for receiving a data retention signal for programming a nonvolatile memory cell that accumulates charges belonging to an intermediate charge region higher than an erasure cell threshold and lower than a program threshold, wherein the nonvolatile memory cell includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

Herein, the semiconductor memory device may further include a buffer region for separating the erasure cell threshold from the intermediate charge region.

Further, the semiconductor memory device may further include a command register for receiving commands including a data retention command for programming the nonvolatile memory cell which accumulates the charges belonging to the intermediate charge region.

Also provided is a semiconductor memory device including: a memory array; a command register constituted to receive a data retention command for performing a data retention processing including a step of programming a nonvolatile memory cell that accumulates charges belonging to an intermediate charge region between an erasing state and a programming state; and a memory array control circuit executing the data retention processing to the memory array in response to the data retention command, wherein the memory array includes a plurality of the nonvolatile memory cells storing a plurality of memory states, and each of the nonvolatile memory cell includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

DETAILED DESCRIPTION OF THE INVENTION

Figure 1:
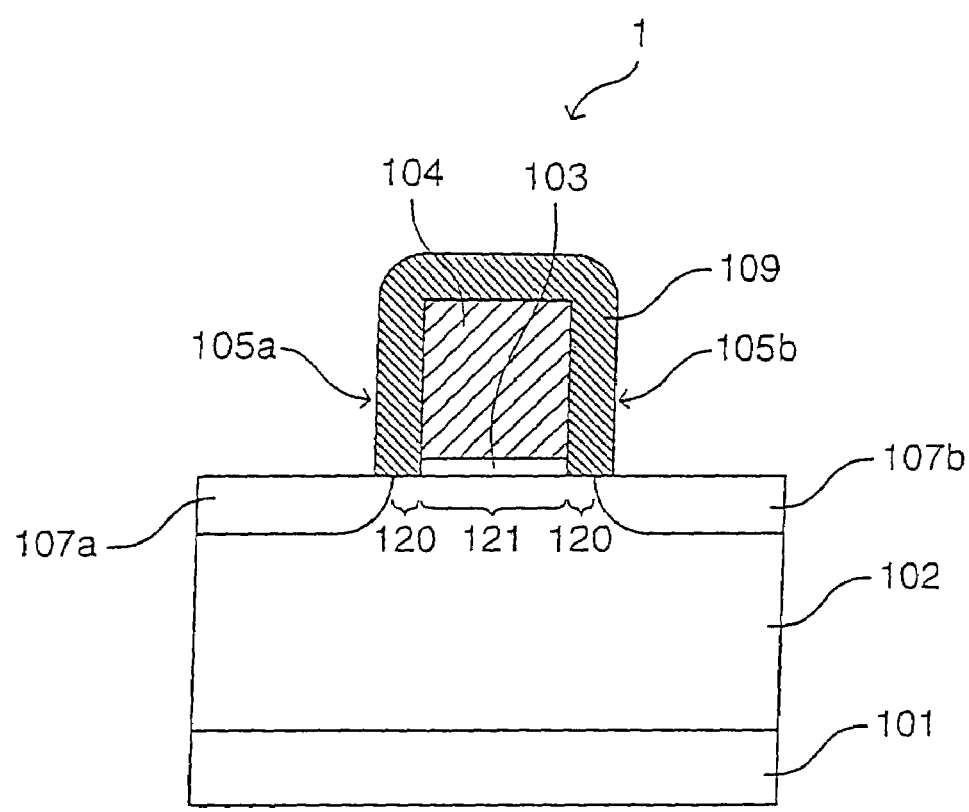
FIG. 1 is a schematic sectional view showing a main part of a memory cell (first embodiment) in a semiconductor memory device according to an embodiment of the present invention.

A semiconductor memory device according to an embodiment of the present invention is mainly constructed by a nonvolatile memory cell, first and second load cells, a reference cell and a program circuit for programming the reference cell in a reference state. Herein, the program means that a desired amount of charges is accumulated in each of the nonvolatile memory cell and the reference cell. Furthermore, the program circuit is a circuit for accumulating the desired amount of charges in each of the nonvolatile memory cell and the reference cell. It is noted that the semiconductor memory device basically adopts a MOS circuit. It is often desirable to mount all of the circuits inclusive of the MOS circuit on a single semiconductor substrate.

The nonvolatile memory cell in the semiconductor memory device is mainly constructed by a semiconductor layer, a gate insulating film, a gate electrode, a channel region, a diffusion region and a memory functional unit. Herein, the channel region is normally a region of the same conductive type as that of the semiconductor layer and denotes a region immediately below the gate electrode. The diffusion region denotes a region of the conductive type opposite to that of the channel region.

Concretely, the nonvolatile memory cell of an embodiment of the present invention may be constructed by a region of a first conductive type as a diffusion region, a region of a second conductive type as a channel region, a memory functional unit disposed across a border of the regions of the first and second conductive types, and an electrode provided via a gate insulating film. It is suitable that the nonvolatile memory cell is constructed by a gate electrode formed on a gate insulating film, two memory functional units formed on both sides of the gate electrode, two diffusion regions disposed on the opposite sides of the gate electrode of the memory functional units, and a channel region disposed below the gate electrode. Hereinafter, the nonvolatile memory cell will be referred to as a sidewall memory cell.

In the semiconductor device of embodiments of the present invention, the semiconductor layer is formed on the semiconductor substrate, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer and a body region may be provided below a channel region.

The gate insulating film is not particularly limited as long as it is usually used for a semiconductor device, and an example thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is formed preferably in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and an example of thereof includes a conductive film, for example, a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. Below the gate electrode, a channel region is formed.

Preferably, the gate electrode is formed only on the sidewalls of the memory functional unit or does not cover the top part of the memory functional unit. By such arrangement, a contact plug can be disposed closer to the gate electrode, so that reduction in the size of the memory cell is facilitated. It is easy to manufacture the sidewall memory cell having such simple arrangement, so that the yield can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

By using the insulating film including a film having the charge retaining function such as a silicon nitride film as the memory functional unit, reliability of storage and retention can be increased. Since the silicon nitride film is an insulator, even in the case where a charge leak occurs in part of the silicon nitride film, the charges in the whole silicon nitride film are not lost immediately. In the case of arranging a plurality of sidewall memory cells, even when the distance between the sidewall memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

In order to increase the reliability of storage and retention, the film having the charge retaining function does not always have to have a film shape. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternatively, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of a film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth almost the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly important that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film is made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The sidewall memory cell can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface of the opening, and the gate electrode material film is patterned in a shape including the opening and larger than the opening, thereby forming the gate electrode and the memory functional unit.

One example of a method for forming the sidewall memory cell according to an embodiment of the present invention will now be described. First, the gate insulating film and the gate electrode are formed on the semiconductor substrate in accordance with known procedures. Subsequently, a silicon oxide film having a thickness of 0.8 to 20 nm, more preferably 3 to 10 nm is formed by thermal oxidation or deposited by CVD (Chemical Vapor Deposition) over the entire semiconductor substrate. Next, a silicon nitride film having a thickness of 2 to 15 nm, more preferably 3 to 10 nm is deposited by the CVD over the entire silicon oxide film. Moreover, another silicon oxide film having a thickness of 20 to 70 nm is deposited by the CVD over the entire silicon nitride film.

Subsequently, the silicon oxide film/silicon nitride film/silicon oxide film are etched back by anisotropic etching, thereby forming the memory functional unit optimum for storing data on the sidewall of the gate electrode in the form of a sidewall spacer.

Thereafter, ions are injected while using the gate electrode and the memory functional unit in the form of the sidewall spacer as masks, thereby forming a diffusion layer region (source/drain region). After that, a silicide process or an upper wiring process may be performed in accordance with known procedures.

In the case of constructing the memory cell array by arranging sidewall memory cells, the best mode of the sidewall memory cell satisfies all of the requirements: for example, (1) the gate electrodes of a plurality of sidewall memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface substantially parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is substantially parallel with the surface of the gate insulating film from the channel region or semiconductor layer and the thickness of the gate insulating film are different from each other; (8) an operation of writing/erasing one sidewall memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. Benefits may be obtained even when fewer than all ten requirements are satisfied. It is sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the sidewall memory cell satisfies the requirements (3) and (9), it is very useful for the following reasons.

First, the bit line contact can be disposed closer to the memory functional unit on the word line sidewall or even when the distance between sidewall memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between sidewall memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each sidewall memory cell. For example, the memory functional units formed on both sides of a single word line shared by a plurality of sidewall memory cells do not have to be isolated for each sidewall memory cell. The memory functional units formed on both sides of one word line can be shared by a plurality of sidewall memory cells sharing the word line. Consequently, a photo etching process for isolating the memory functional unit becomes unnecessary, and the manufacturing process is simplified. Further, a margin for positioning in the photolithography process and a margin for film reduction by etching become unnecessary, so that the margin between neighboring sidewall memory cells can be reduced. Therefore, as compared with the case where the charge retaining region in the memory functional unit is made of a conductor (for example, polysilicon film), even when the memory functional unit is formed at the same microfabrication level, a sidewall memory cell occupied area can be reduced. In the case where the charge retaining region in the memory functional unit is made of a conductor, the photo etching process for isolating the memory functional unit for each sidewall memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield can be increased. Therefore, it facilitates formation with a transistor as a component of a logic circuit or an analog circuit, and a cheap semiconductor memory device can be obtained.

Additional benefits are obtained where not only the requirements (3) and (9) but also the requirement (6) are satisfied.

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a sidewall memory cell is dominant more than that of a sidewall memory cell. Consequently, omission or down sizing of the voltage boosting circuit for a sidewall memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

A transistor may be connected in series with one of or both sides of a sidewall memory cell, or the sidewall memory cell may be mounted on the same chip with a logic transistor. In such a case, the semiconductor device of the present invention, particularly, the sidewall memory cell can be formed by a process having high compatibility with a process of forming a normal standard transistor such as a transistor or a logic transistor, they can be formed simultaneously. Therefore, a process of forming both the sidewall memory cell and a transistor or a logic transistor is very simple and, as a result, a cheap embedded device can be obtained.

The sidewall memory cell can store information of two or more values in one memory functional unit. Thus, the sidewall memory cell can function as a memory cell for storing information of four or more values. The sidewall memory cell may store binary data only. The sidewall memory cell is also allowed to function as a memory cell having the functions of both a selection transistor and a memory transistor by a variable resistance effect of the memory functional unit.

The semiconductor memory device of embodiments of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multi-processor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of embodiments of the present invention may be provided as at least a part of a control circuit or a data storing circuit of an electronic device or, as necessary, detachably assembled.

DESCRIPTION OF THE PREFERRED EMBODIMENTS

Hereinafter, embodiments of the semiconductor memory device, the display device and the portable electronic apparatus of the present invention will be described in detail with reference to the drawings.

First Embodiment

A semiconductor memory device of a first embodiment has a sidewall memory cell 1 as shown in FIG. 1.

The sidewall memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
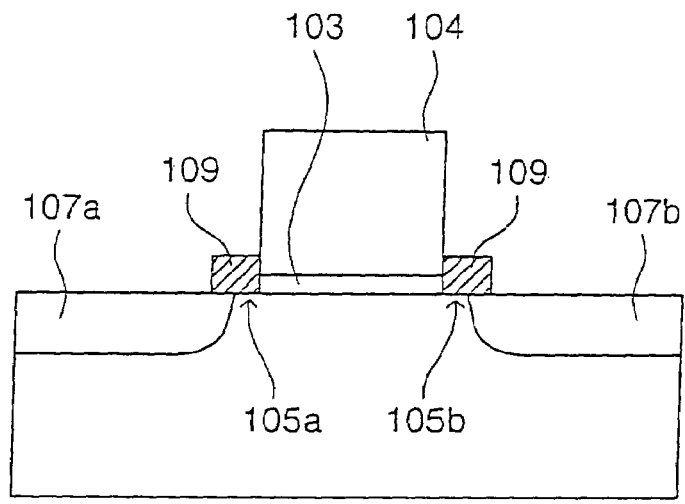
FIGS. 2A and 2B are schematic sectional views each showing a main part of a modification of the memory cell (first embodiment) in the semiconductor memory device according to an embodiment of the present invention.
Figure 2B:
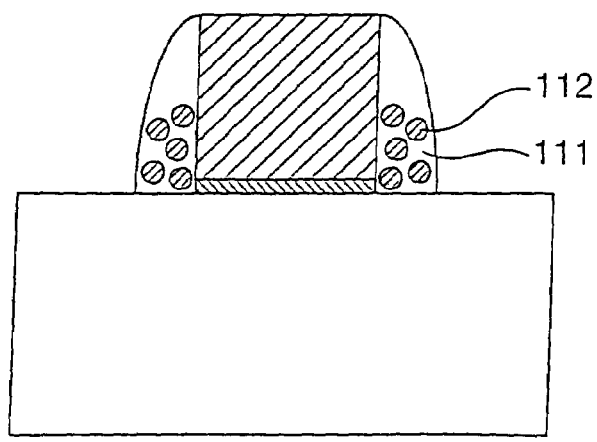

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go through the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the sidewall memory cell will be described with reference to FIGS. 3 and 4. The case where whole memory functional units 131a and 131b have the function of retaining charges will be described. "Writing" denotes herein injection of electrons into the memory functional units 131a and 131b when the sidewall memory cell is of the N channel type. Hereinafter, on assumption that the sidewall memory cell is of the N channel type, description will be given.

Figure 3:
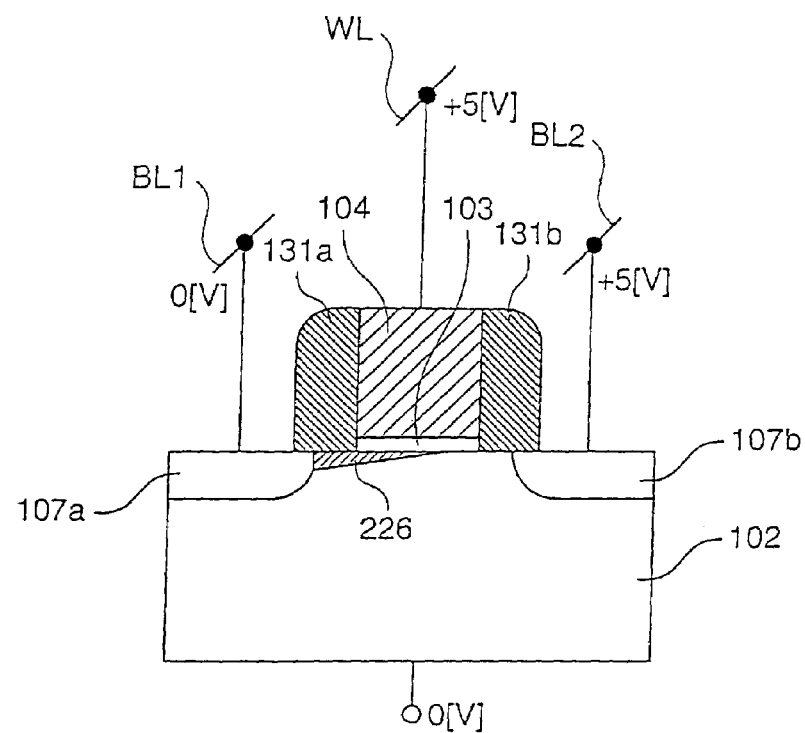
FIG. 3 is a diagram for describing a writing operation of the memory cell (first embodiment) in the semiconductor memory device according to an embodiment of the present invention.

In order to inject electrons (write) the second memory functional unit 131b, as shown in FIG. 3, the first diffusion region 107a of the N type is set as a source electrode, and the second diffusion region 107b of the N type is set as a drain electrode. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). By injection of the hot electrons into the second memory functional unit 131b, writing is performed. Since hot electrons are not generated in the vicinity of the first memory functional unit 131a, writing is not performed.

Figure 4:
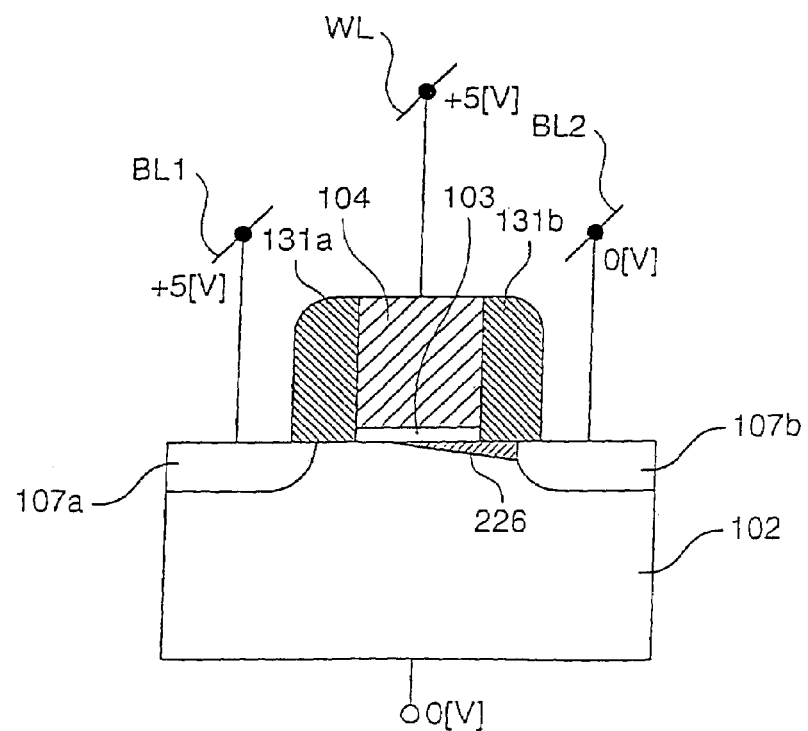
FIG. 4 is a diagram for describing a writing operation of the memory cell (first embodiment) in the semiconductor memory device according to an embodiment of the present invention.

On the other hand, in order to inject electrons (write) into the first memory functional unit 131a, as shown in FIG. 4, the second diffusion region 107a is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. By interchanging the source and drain regions so as to be different from the case of injecting electrons into the second memory functional unit 131b, electrons are injected into the first memory functional unit 131a and writing can be performed.

The principle of erasing operation of the sidewall memory cell will now be described with reference to FIGS. 5 and 6.

Figure 5:
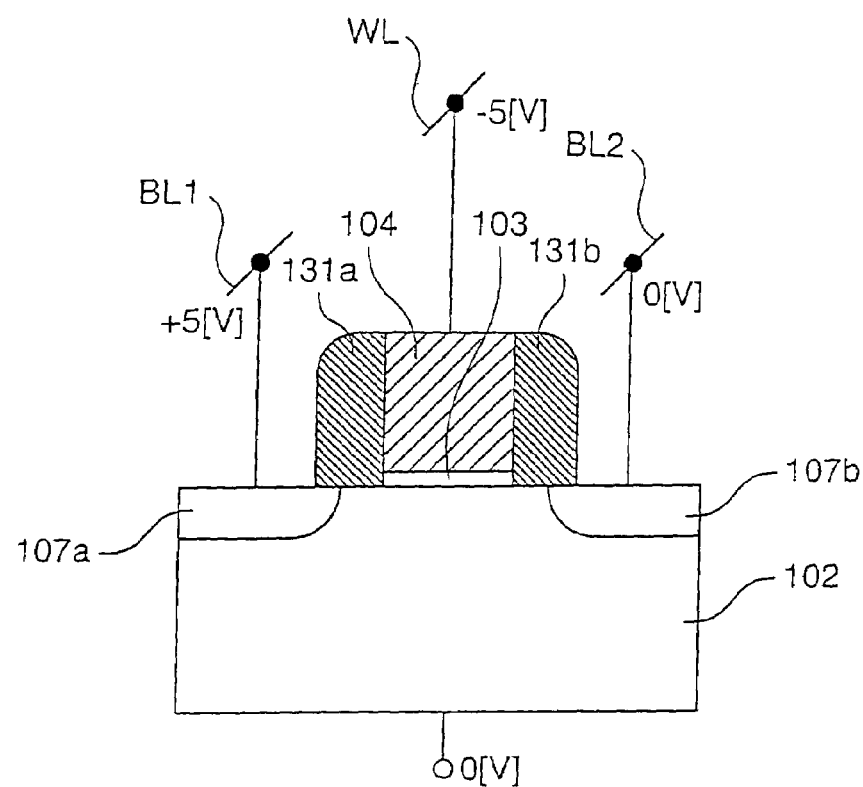
FIG. 5 is a diagram for describing an erasing operation of the memory cell (first embodiment) in the semiconductor memory device according to an embodiment of the present invention.

In a first method of erasing information stored in the first memory functional unit 131a, by applying positive voltage (for example, +5 V) to the first diffusion region 107a and applying 0 V to the P-type well region 102 as shown in FIG. 5, the PN junction between the first diffusion region 107a and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
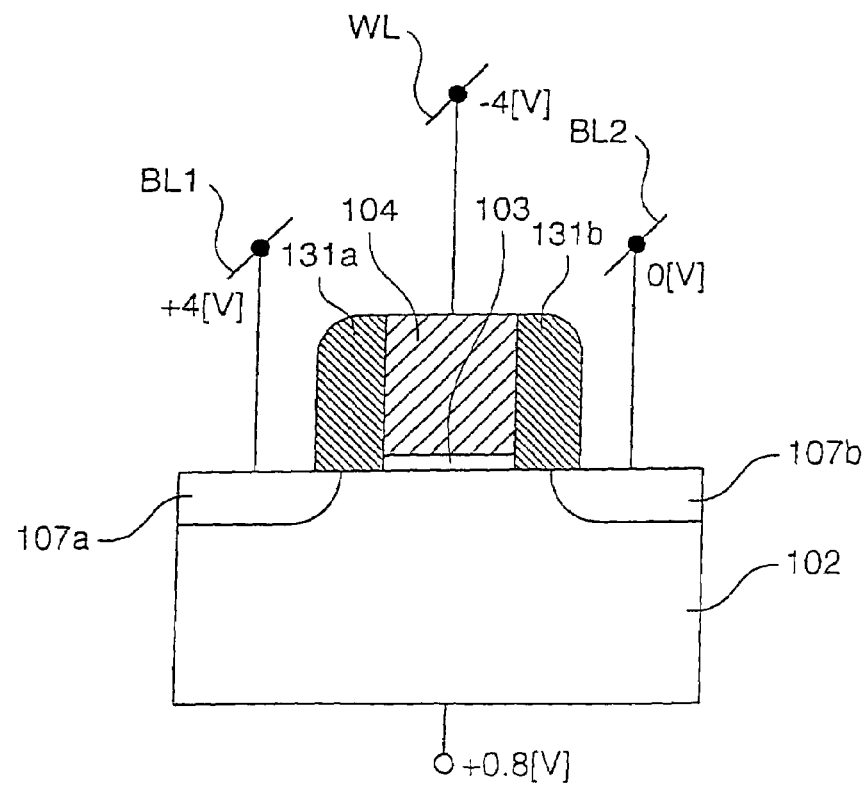
FIG. 6 is a diagram for describing an erasing operation of the memory cell (first embodiment) in the semiconductor memory device according to an embodiment of the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the sidewall memory cell due to hot carriers can be suppressed.

In any of the erasing methods, over-erasure does not occur easily in the sidewall memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a sidewall memory cell becomes impossible occurs. On the other hand, in the sidewall memory cell in the semiconductor memory device of embodiments of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Figure 7:
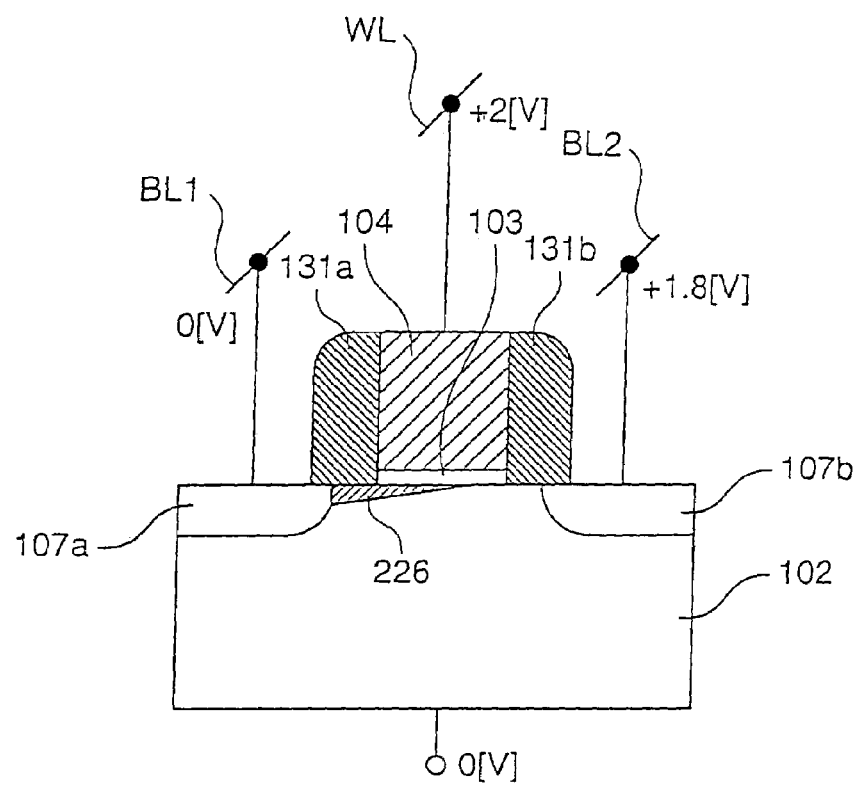
FIG. 7 is a diagram for describing a reading operation of the memory cell (first embodiment) in the semiconductor memory device according to an embodiment of the present invention.

Further, the principle of reading operation of the sidewall memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. In the case of applying a voltage so as to perform the pinch-off operation, thereby reading information, it is possible to determine with higher accuracy the state of charge accumulation in the first memory functional unit 131a without influence of the presence/absence of charge accumulation in the second memory functional unit 131b.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be constructed.

In the above-described operating method, by interchanging the source electrode and the drain electrode, writing and erasing of two bits per one transistor are performed. Alternately, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As will be apparent from the above description, in the sidewall memory cell in the semiconductor memory device of embodiments of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
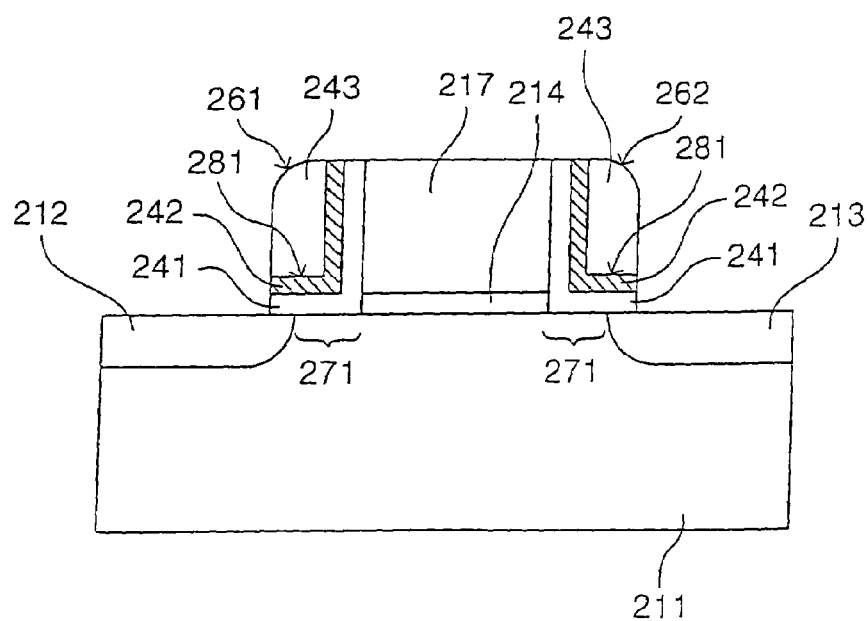
FIG. 8 is a schematic sectional view showing a main part of a memory cell (second embodiment) in the semiconductor memory device according to an embodiment of the present invention.

A sidewall memory cell in a semiconductor memory device according to a second embodiment has a configuration substantially similar to that of the sidewall memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film is regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the sidewall memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
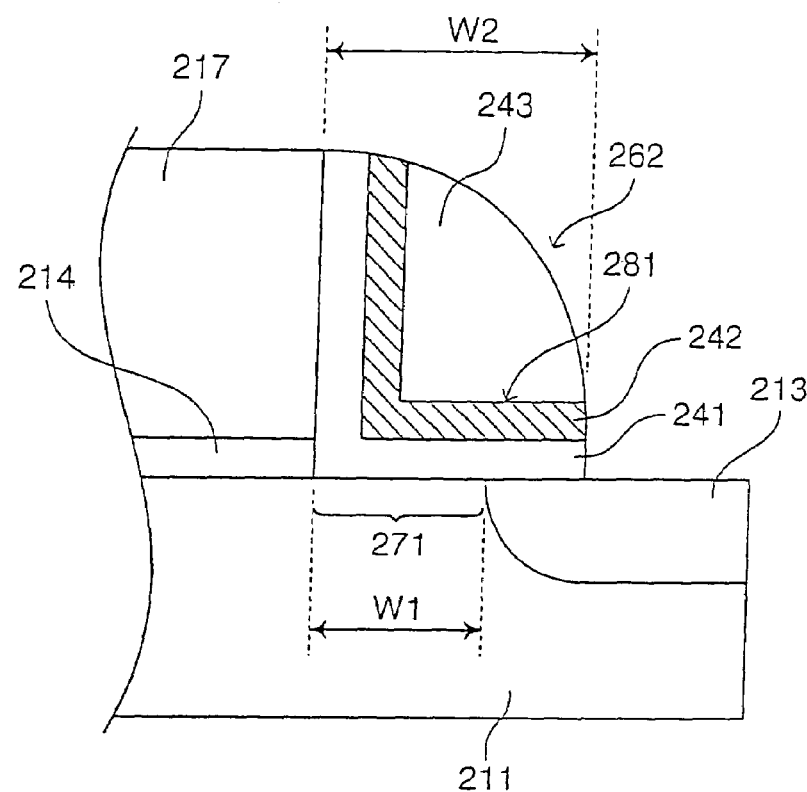
FIG. 9 is an enlarged schematic sectional view of the main part shown in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
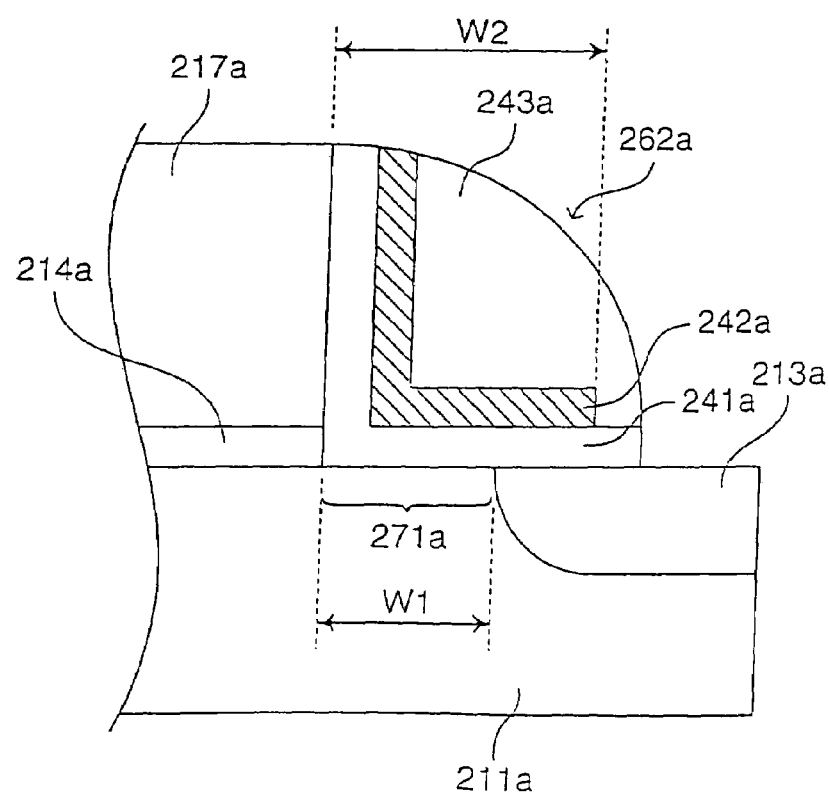
FIG. 10 is an enlarged schematic sectional view of a modification of the main part shown in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
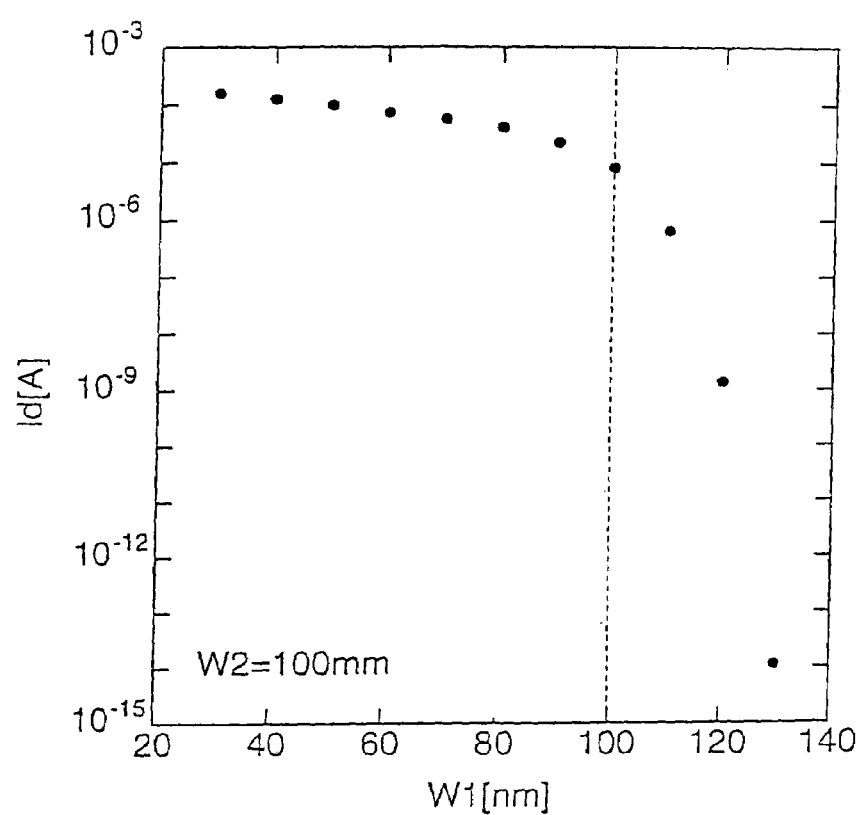
FIG. 11 is a graph showing electric characteristics of the memory cell (second embodiment) in the semiconductor memory device according to an embodiment of the present invention.

FIG. 11 shows drain current Id when the width W2 of the memory functional unit 262 is fixed to 100 nm and the offset amount W1 is changed in the structure of the sidewall memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As should be apparent from FIG. 11, in the range where W1 is 100 nm or more (that is, the silicon nitride film 242 and the diffusion region 213 do not overlap with each other), the drain current sharply decreases. Since the drain current value is substantially proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, sidewall memory cell arrays were produced. In the case where W1 is 60 nm, the silicon nitride film 242 and the diffusion regions 212 and 213 overlap with each other by 40 nm as a design value. In the case where W1 is 100 nm, there is no overlap as a design value. Reading time of the sidewall memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
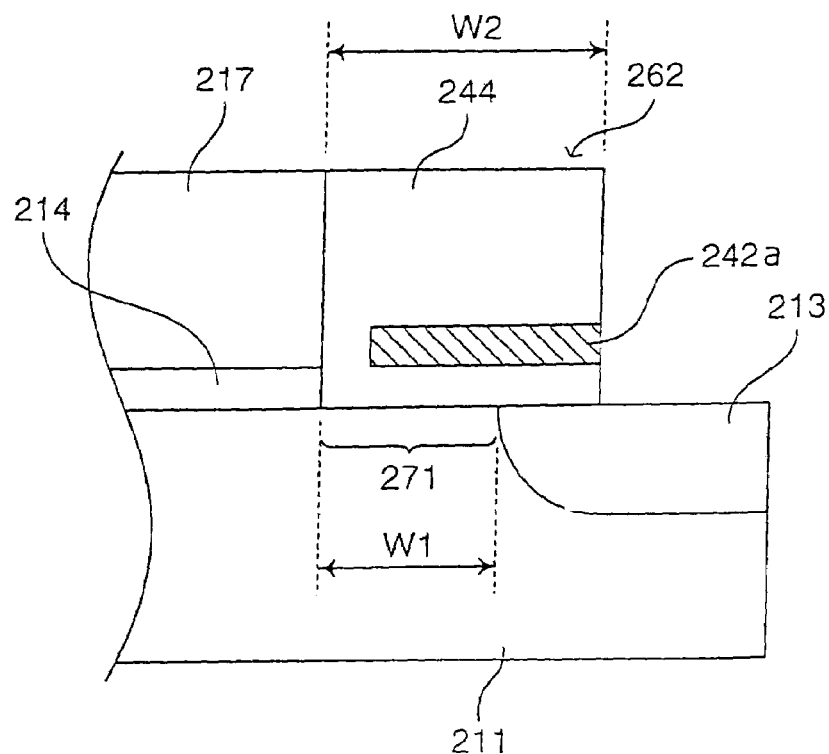
FIG. 12 is a schematic sectional view showing a main part of a modification of the memory cell (second embodiment) in the semiconductor memory device according to an embodiment of the present invention.

The memory functional unit preferably includes the charge retaining film disposed substantially in parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface substantially parallel with the surface of the gate insulating film 214. In other words, it is preferable that the silicon nitride film 242a is formed at a level parallel to the level corresponding to the surface of the gate insulating film 214.

By the existence of the silicon nitride film 242a substantially parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a substantially in parallel with the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is substantially parallel to the surface of the gate insulating film 214 and the channel region (or well region). By the insulating film, dissipation of the charges accumulated in the charge retaining film is suppressed and a sidewall memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained substantially constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the sidewall memory cell can be reduced very much.

Third Embodiment

Figure 13:
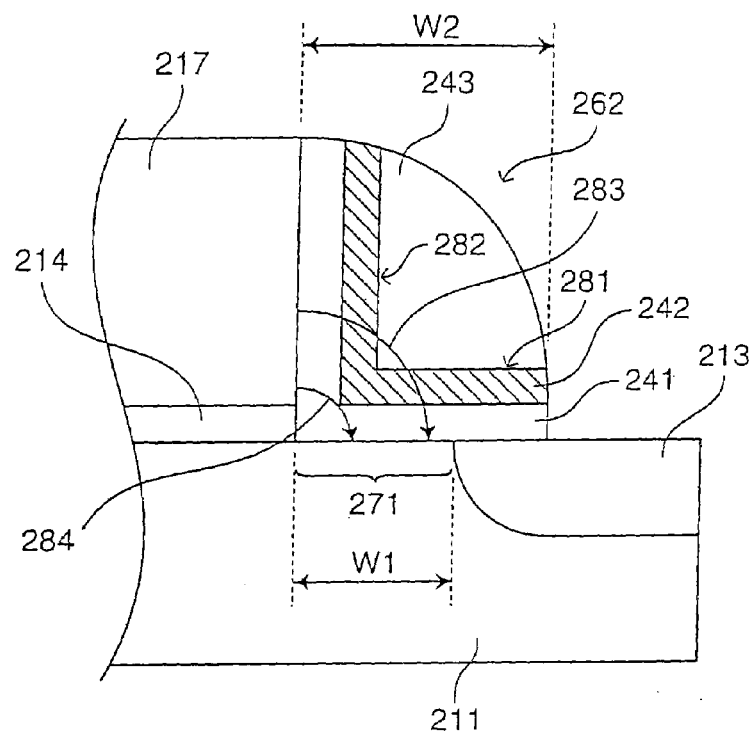
FIG. 13 is a schematic sectional view showing a main part of a memory cell (third embodiment) in the semiconductor memory device according to an embodiment of the present invention.

The memory functional unit 262 in a semiconductor memory device of a third embodiment has a shape in which the silicon nitride film 242 as a charge retaining film has substantially uniform thickness and is disposed substantially in parallel with the surface of the gate insulating film 214 as shown in FIG. 13 (region 281) and, further, substantially in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended substantially parallel with the side face of the gate electrode. The insulating film prevents injection of charges from the gate electrode into the charge retaining film and accordingly prevents a change in the electric characteristics. Thus, the reliability of the sidewall memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

Fourth Embodiment

In a fourth embodiment, optimization of the gate electrode, the memory functional unit, and the distance between the source and drain regions of a sidewall memory cell in a semiconductor memory device will be described.

Figure 14:
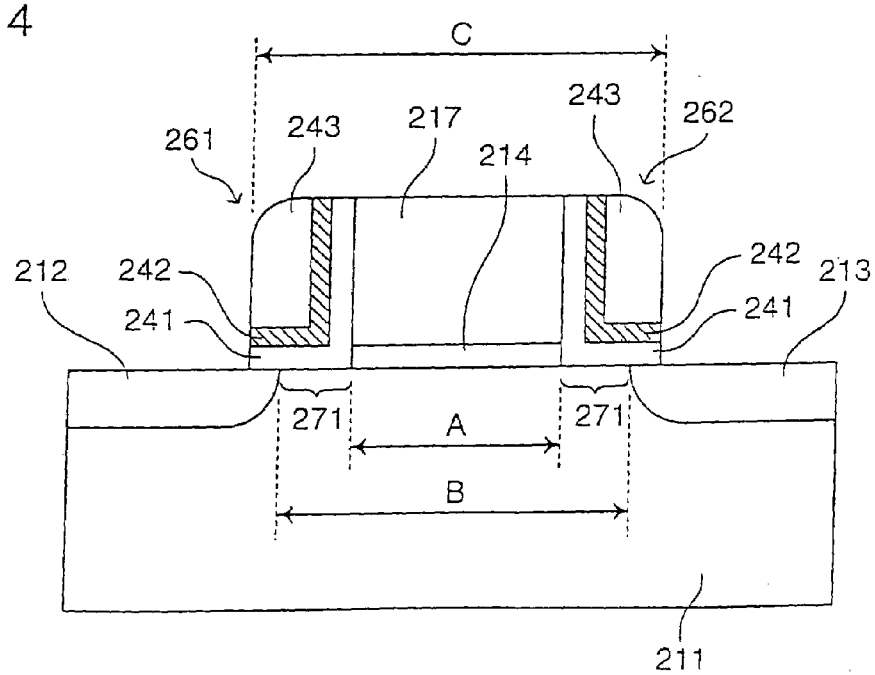
FIG. 14 is a schematic sectional view showing a main part of a memory cell (fourth embodiment) in the semiconductor memory device according to an embodiment of the present invention.

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a sidewall memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
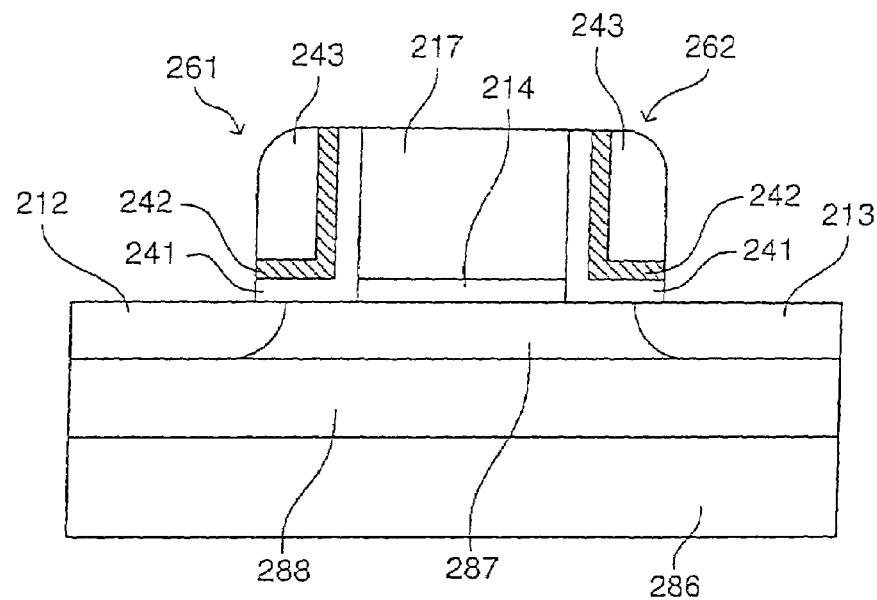
FIG. 15 is a schematic sectional view showing a main part of a memory cell (fifth embodiment) in the semiconductor memory device according to an embodiment of the present invention.

A sidewall memory cell of a semiconductor memory device in a fifth embodiment has a substantially similar configuration to that of the second embodiment except that an SOI substrate is used as the semiconductor substrate in the second embodiment as shown in FIG. 15.

In the sidewall memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the sidewall memory cell as well, action and effect similar to those of the sidewall memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
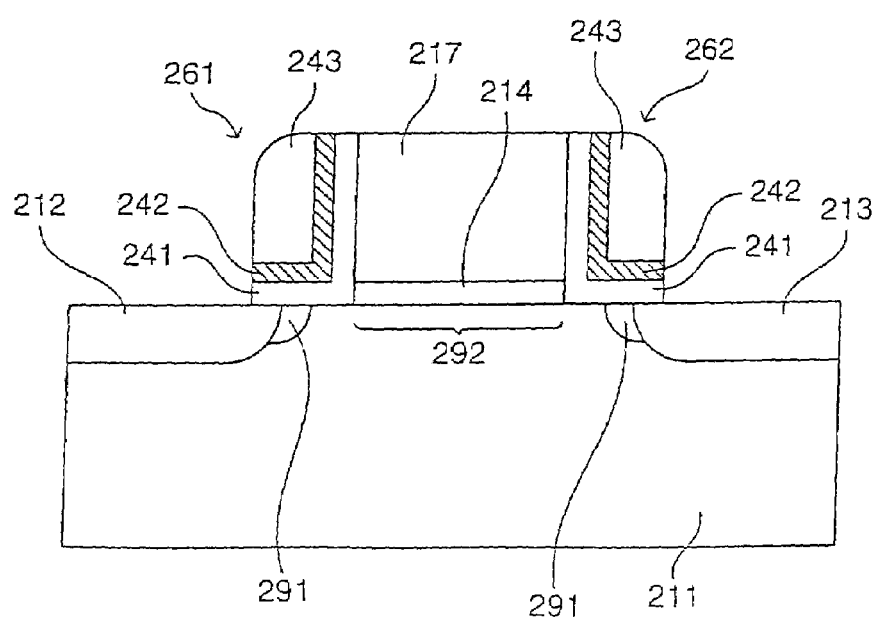
FIG. 16 is a schematic sectional view showing a main part of a memory cell (sixth embodiment) in the semiconductor memory device according to an embodiment of the present invention.

A sidewall memory cell in a semiconductor memory device in a sixth embodiment has, as shown in FIG. 16, a configuration substantially similar to that of the sidewall memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5\times10^{17}$ to $1\times10^{19}$ cm$^{-3}$. The P-type impurity concentration of the region 292 can be set to, for example, $5\times10^{16}$ to $1\times10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the sidewall memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
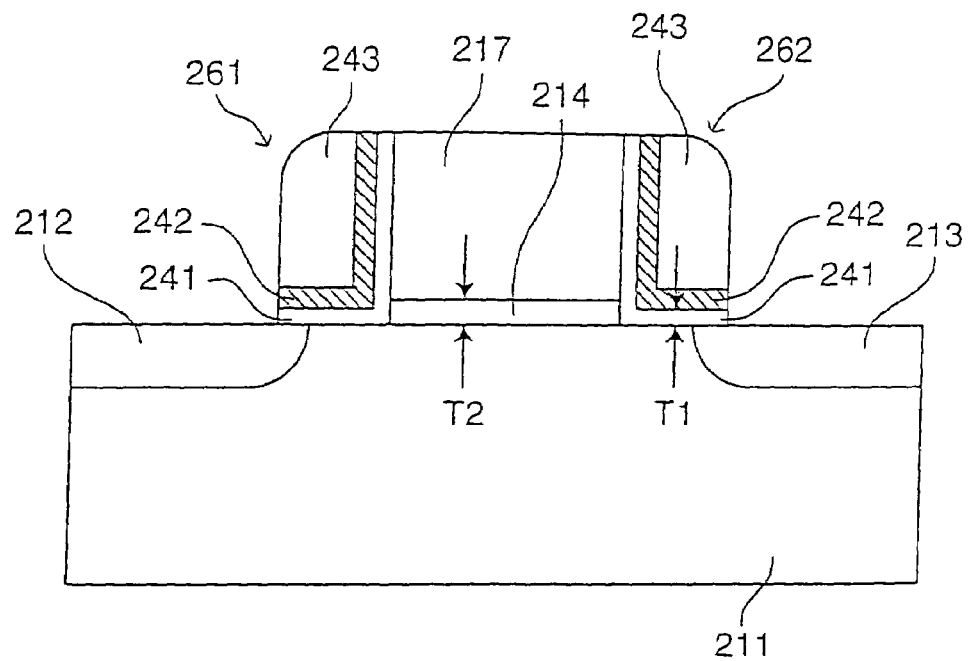
FIG. 17 is a schematic sectional view showing a main part of a memory cell (seventh embodiment) in the semiconductor memory device according to an embodiment of the present invention.

A sidewall memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the sidewall memory cell for the following reason.

In the sidewall memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the sidewall memory cell is inhibited.

As should be apparent from the above, by setting T1<T2, without deteriorating the withstand voltage performance of the memory, the voltage of the writing and erasing operations is decreased, or the writing operation and erasing operation are performed at high speed and, further, the memory effect can be increased. More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting the nonvolatile memory of an embodiment of the present invention as a nonvolatile memory for image adjustment on the liquid crystal driver LSI, in the sidewall memory cell, the thickness of the insulating film separating the charge retaining film (silicon nitride film 242) and the channel region or well region can be designed optimally independently of the thickness of the gate insulating film. For example, the thickness can be individually set as T1=20 nm and T2=10 nm for a sidewall memory cell having a gate electrode length (word line width) of 250 nm, so that a sidewall memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
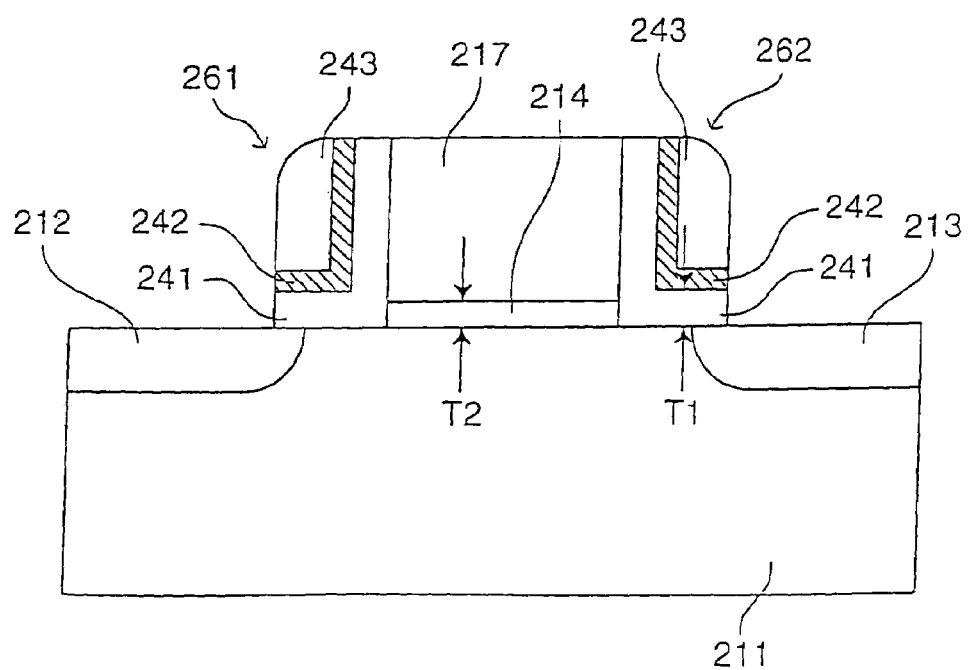
FIG. 18 is a schematic sectional view showing a main part of a memory cell (eighth embodiment) in the semiconductor memory device according to an embodiment of the present invention.

A sidewall memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the sidewall memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the sidewall memory cell, since T1 and T2 can be individually designed as described above, size reduction is made possible.

For example, for a sidewall memory cell having a gate electrode length (word line width) of 45 nm, T2=4 nm and T1=7 nm are individually set, and a sidewall memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the sidewall memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the sidewall memory cell having a gate length which is reduced to be equal to or less than the gate length of a logic transistor of the same process generation can be realized.

Ninth Embodiment

A ninth embodiment relates to a change in the electric characteristic at the time of rewriting a sidewall memory cell of a semiconductor memory device.

Figure 19:
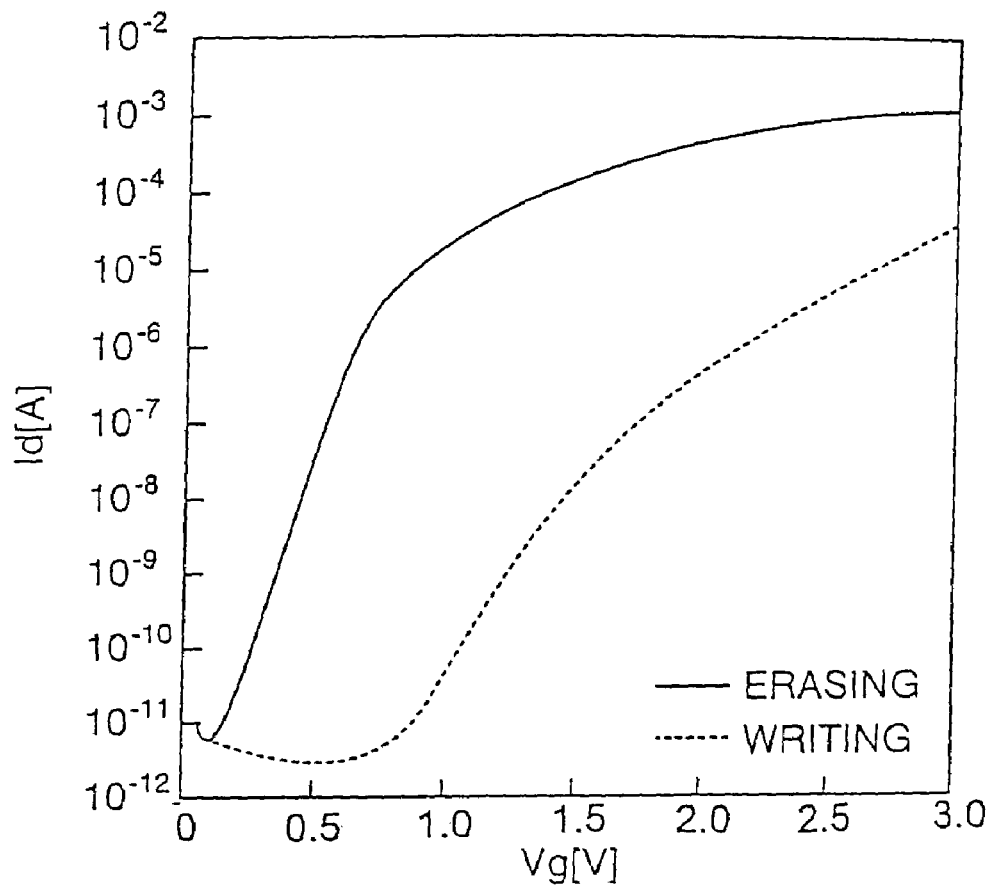
FIG. 19 is a graph showing electric characteristics of a memory cell (ninth embodiment) in the semiconductor memory device according to an embodiment of the present invention.

In an N-channel type sidewall memory cell, when an amount of charges in a memory functional unit changes, a drain current (Id)-gate voltage (Vg) characteristic (actual measurement value) as shown in FIG. 19 is exhibited.

Figure 22:
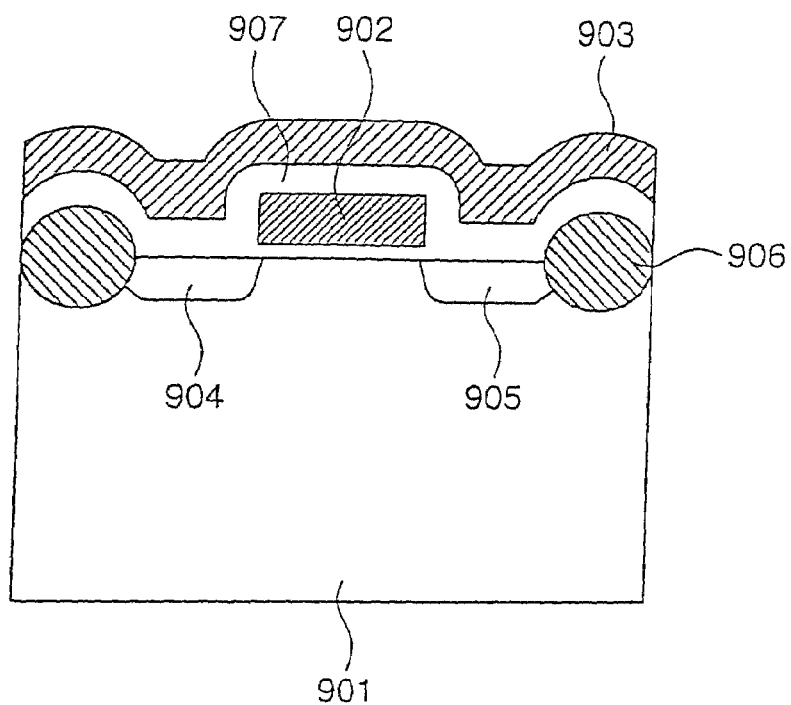
FIG. 22 is a schematic sectional view showing a main part of a conventional flash memory.
Figure 23:
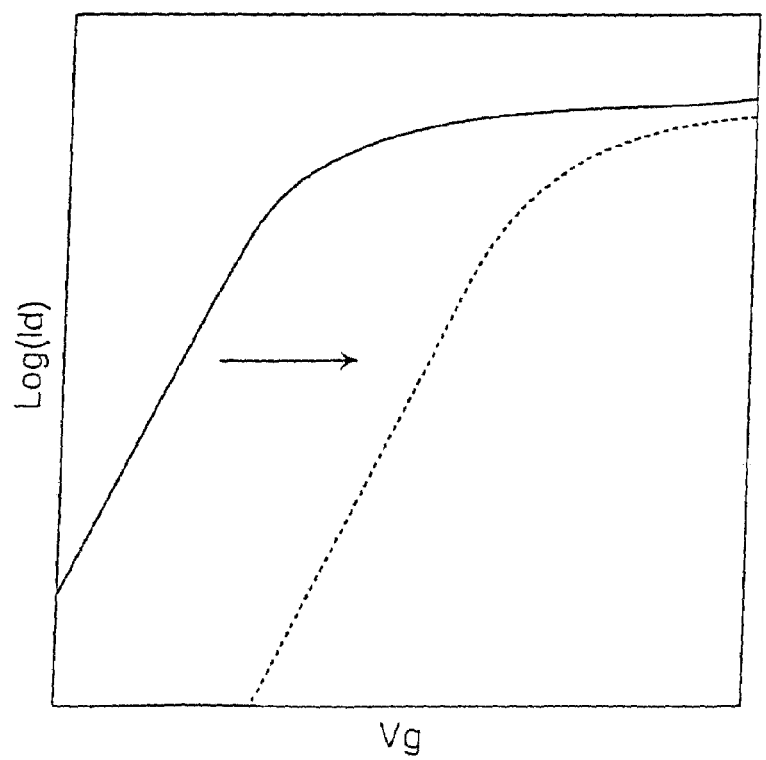
FIG. 23 is a graph showing electric characteristics of a conventional flash memory.

As will be clear from FIG. 19, in the case of performing a writing operation in an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 22).

Appearance of such a characteristic is a peculiar phenomenon which occurs since the gate electrode and the diffusion region are offset from each other, and the gate electric field does not easily reach the offset region. When the sidewall memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the sidewall memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As will be understood from the above, in the sidewall memory cell in the semiconductor memory device of embodiments of the present invention, the drain current ratio between the writing operation and the erasing operation can be particularly made high.

As described above in the first to ninth embodiments, the sidewall memory cell includes the insulating film for separating the film having the surface substantially in parallel to the surface of the gate insulating film and having the function of retaining charges from the channel region or the semiconductor layer, wherein the insulating film is thinner than the gate insulating film and is 0.8 nm or more, thus facilitating the injection of the electric charge into the memory functional unit. As a result, it is possible to increase the speed of the writing operation, so as to shorten the writing time by the reference cell.

Furthermore, since the memory functional unit provided in the sidewall memory cell includes the film having the surface substantially in parallel to the surface of the gate insulating film and having the function of retaining charges, variations in memory effect can be suppressed. Additionally, in the present embodiments in which the above-described sidewall memory cell is used, the design margin with respect to the variations can be largely set, thus facilitating the design.

In addition, in the above-described sidewall memory cell, the charge retaining film inside of the memory functional unit is the insulating film, which is strongly resistant against the leakage of charges and is excellent in retention characteristics. In this manner, since the sidewall memory cell excellent in charge retention characteristics is used and the current of the reference cell using the same sidewall memory cell is precisely set, the reading operation can be performed for a longer period of time.

Moreover, since the sidewall memory cell includes the insulating film for separating the film having the surface substantially in parallel to the surface of the gate insulating film and having the function of retaining charges from the channel region or the semiconductor layer, wherein the insulating film is thicker than the gate insulating film and is 20 nm or less, it is excellent in retention characteristics. In this manner, since the sidewall memory cell excellent in charge retention characteristics is used and the current of the reference cell using the same sidewall memory cell is precisely set, the reading operation can be performed for a longer period of time.

Furthermore, since the memory functional unit provided in the sidewall memory cell includes the film having the surface substantially in parallel to the surface of the gate insulating film and having the function of retaining charges, variations in retention characteristics can be suppressed. In this manner, since the sidewall memory cell excellent in charge retention characteristics is used and the current of the reference cell using the same sidewall memory cell is precisely set, the reading operation can be performed for a longer period of time.

Tenth Embodiment

In a tenth embodiment, a semiconductor memory device in which the plurality of sidewall memory cells in the first to eighth embodiments are arranged and a method of operating this semiconductor memory device will be described.

In particular, a method of improving the data retention ability of the sidewall memory cell which is the nonvolatile memory cell and a circuit configuration of the sidewall memory cell will be described.

By the method to be described below, the data retention ability of the memory cell according to the present invention can be improved, and the semiconductor memory device having good data retention characteristics and high reliability can be provided.

In this embodiment, a series of data retention processings for one nonvolatile memory cell (hereinafter, simply referred to as "memory cell") will be described. It is noted that since two memory functional units according to the present invention are arranged in one memory cell, the processings such as level determination and group selection are performed individually on the respective two memory functional units.

Figure 24:
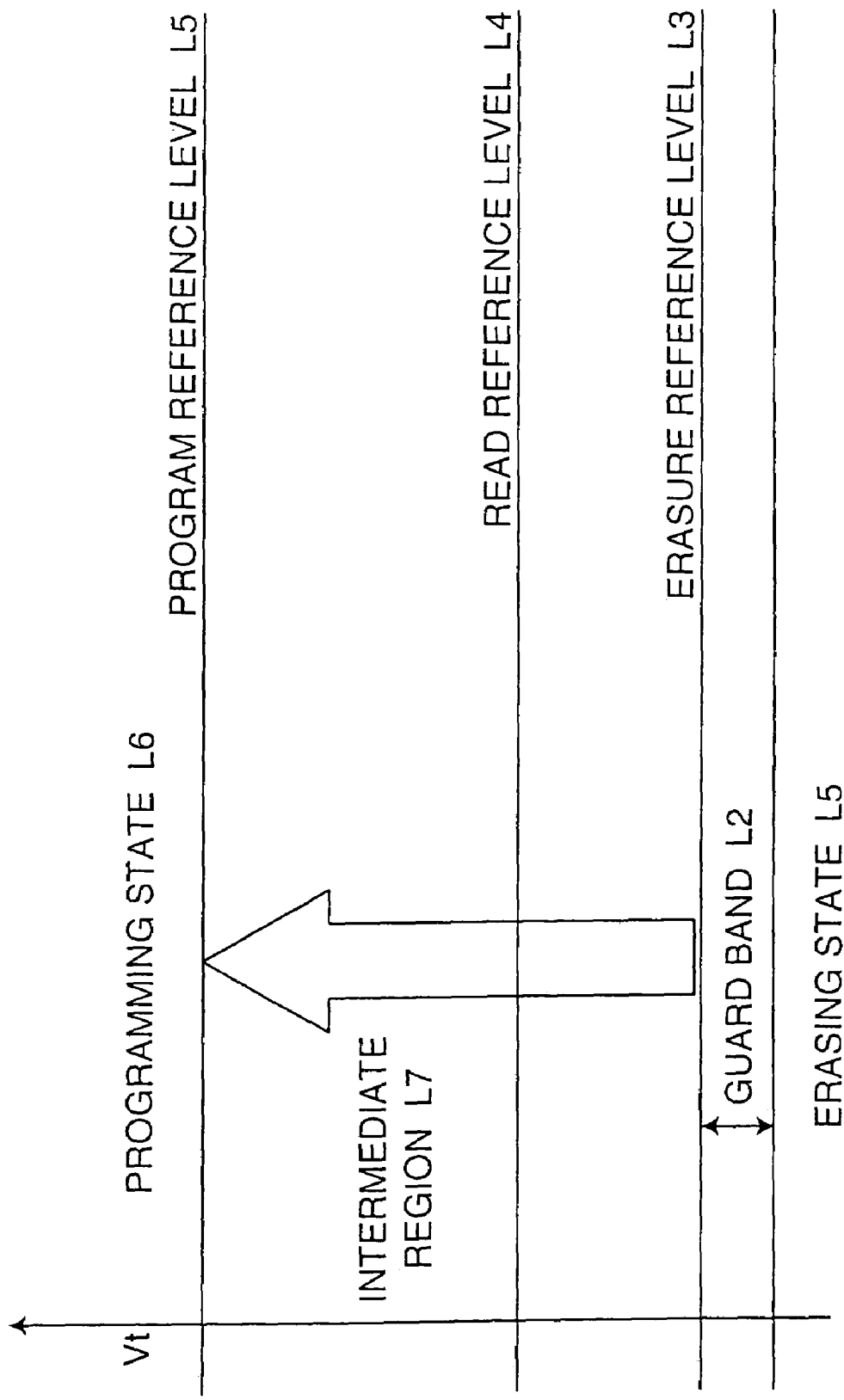
FIG. 24 is a diagram for describing a charge region of a nonvolatile memory cell according to an embodiment of the present invention.

FIG. 24 is a diagram for describing a charge region (potential level) according to an embodiment of the present invention.

According to an embodiment of the present invention, memory cells that accumulates charges belonging to an intermediate region L7 between a programming state L6 and an erasing state L1 are selected from among a plurality of memory cells. The memory cells thus selected include memory cells which were originally in the programming state L6 but currently belong to the intermediate region L7 because of charge leakage.

In FIG. 24, Vt denotes a threshold voltage of each memory cell.

Further, in the sidewall memory according to an embodiment of the present invention, charges are separately accumulated in the respective two memory functional units in each memory cell. A potential level of charges accumulated in each of these memory functional unit is compared with a predetermined reference level to thereby select the memory cells to be programmed.

If a certain memory cell has the voltage Vt higher than a program reference level L5, it is determined that the memory cell is in the programming state L6. If the memory cell has the voltage Vt lower than an erasure reference level L3, it is determined that the memory cell is in the erasing state L1. The intermediate region L7 is present between the program reference level L5 and the erasure reference level L3, and a guard band region L2 is present below the intermediate region L7. The read reference level L4 is normally present in the intermediate region L7.

According to an embodiment of the present invention, the memory cells the voltage Vt of each of which belongs to the intermediate region L7 are selected. When such memory cells are selected, each of the memory cells is programmed to raise the voltage Vt to the program reference level L5. The program reference level is, for example, about 1.0 V and the erasure reference level is, for example, about 0.6 V. However, the present invention is not limited thereto.

Figure 25:
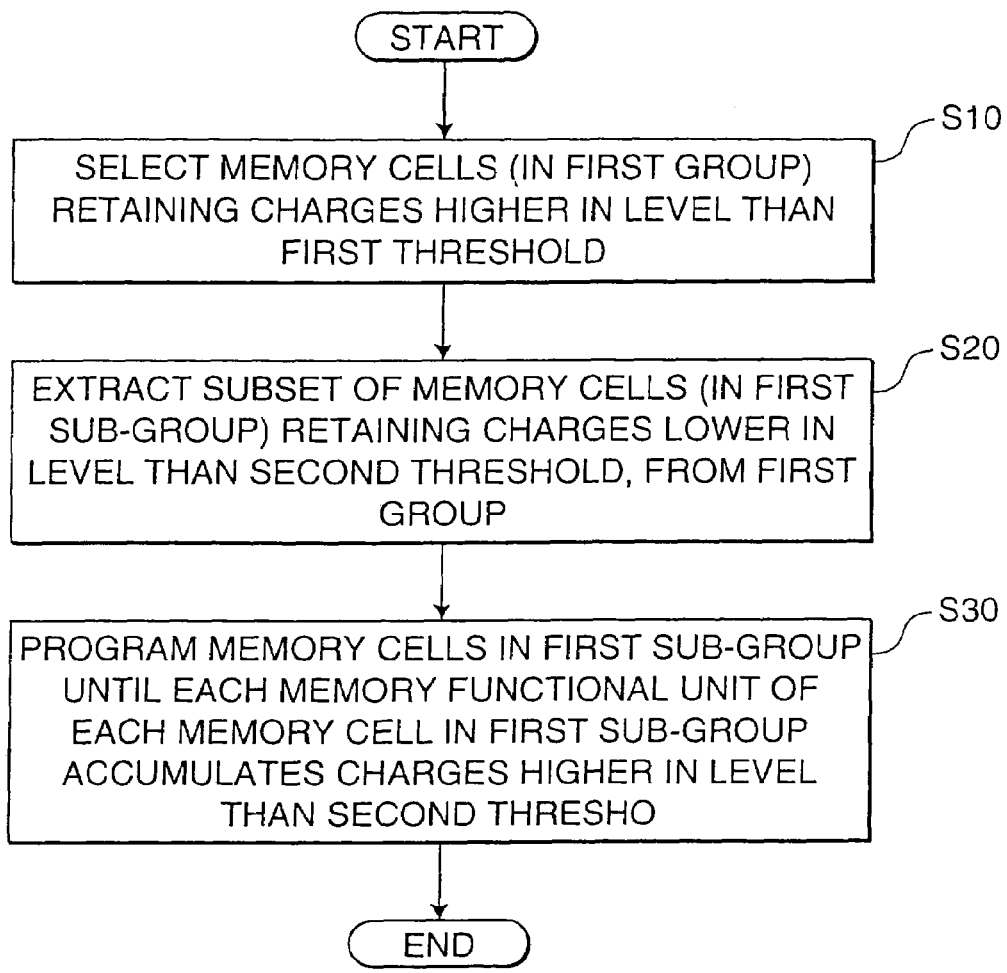
FIG. 25 is a flowchart for describing a series of steps of a data retention processing performed to improve a data retention ability.

FIG. 25 is a flowchart for describing a series of steps of the data retention processing performed to improve the data retention ability.

In step S10, memory cells (first group of memory cells) retaining charges higher in level than a predetermined first threshold are selected.

In step S20, a subset of memory cells (first sub-group of memory cells) retaining charges lower in level than a predetermined second threshold are extracted from the memory cells in the first group.

In step S30, each of the memory cells in the first sub-group is programmed until charges higher in level than the second threshold are accumulated in each of the two memory functional units in the memory cell. The processing is then finished.

Instead of selecting the first group of memory cells in the charge state in the intermediate region L7, the voltage of each memory cell may be compared with a threshold to determine whether it is necessary to program the memory cell.

Figure 26:
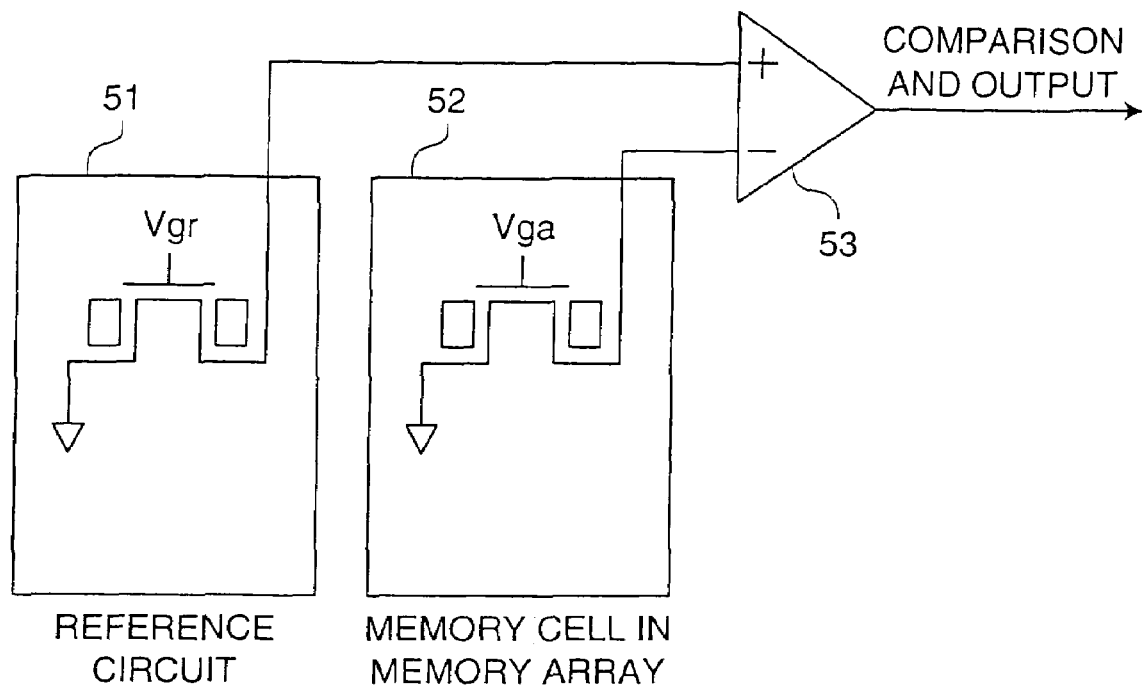
FIG. 26 is a circuit diagram showing a sense amplifier employed to determine a voltage Vt of a memory cell.

FIG. 26 shows a typical sense amplifier employed to determine the voltage Vt of the memory cell. Similarly to the well-known amplifier, a comparison circuit 53 compares the memory cell with a reference cell so as to determine whether the voltage Vt of each memory cell in the memory array is higher or lower than the voltage Vt of the reference cell. For example, a "data retention" reference cell is created to correspond to a memory cell having the voltage at a level obtained by adding the guard band L2 to the erasure reference level L3. The comparison circuit 53 compares this data retention reference level with the voltage of each memory cell and, thereby, determines whether it is necessary to program the memory cell into the programming state L6.

In addition, in order to prevent erroneous determination that an erasure memory cell is in the intermediate region L7, the guard band L2 of about 100 mV may be provided as a buffer. By providing such a buffer, it is possible to more accurately extract "program" memory cells in which charges are lost.

A width of this guard band L2 is not limited to about 100 mV. For example, in the case where the program reference level L5 is 2.0 V and the erasure reference level L3 is 0.4 V, the guard band L2 may be set at about 400 mV. In this way, the width of the guard band can be varied according to the length of the offset region, the density of P-type impurities adjacent to the N-type diffusion region, the thickness of the gate oxide film, and the like.

Further, in order to emulate a new data retention reference cell, either a read reference cell or an erasure reference cell may be used.

In FIG. 26, a gate voltage Vgr of a reference circuit 51 may be changed using a gate voltage Vga of a memory cell 52 so as to emulate the reference circuit 51 according to the changed voltage Vt.

For example, the erasure reference cell may be obtained based on an equation of Vgr=Vga−(Guard band voltage).

In this case, if Vga is 1.8 V and the guard band is 100 mV, Vgr is 1.7 V.

Figure 27:
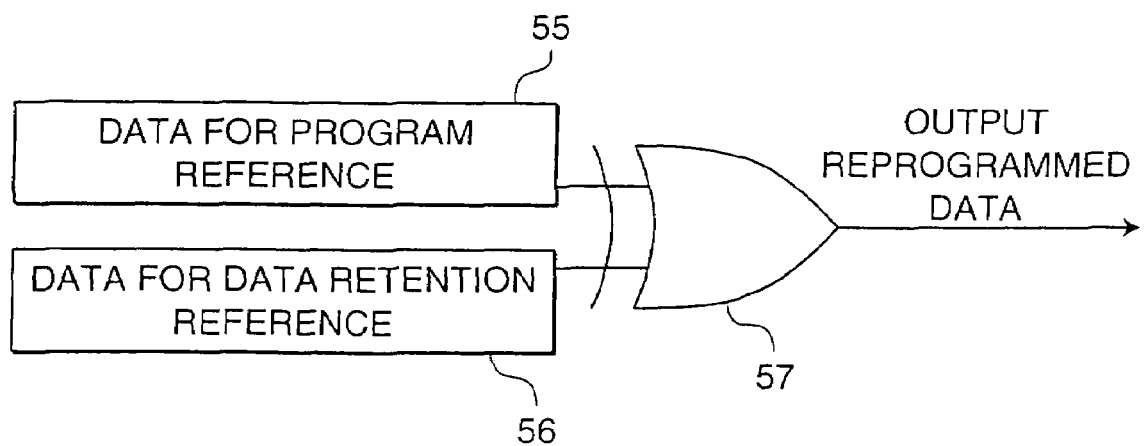
FIG. 27 is a diagram for describing a processing for comparing two pieces of data.

FIG. 27 shows a circuit that compares a read result 55 from the memory cell in the first group for program reference with a read result 56 from the memory cell in the first group for data retention reference. FIG. 27 shows that the comparison is made through an XOR gate 57. In the case where there is a difference between the two results 55 and 56, this indicates that at least one of the memory cells has lost charges. The memory cell indicated as the memory cell that has lost charges is reprogrammed to the program reference level L5.

Figure 28:
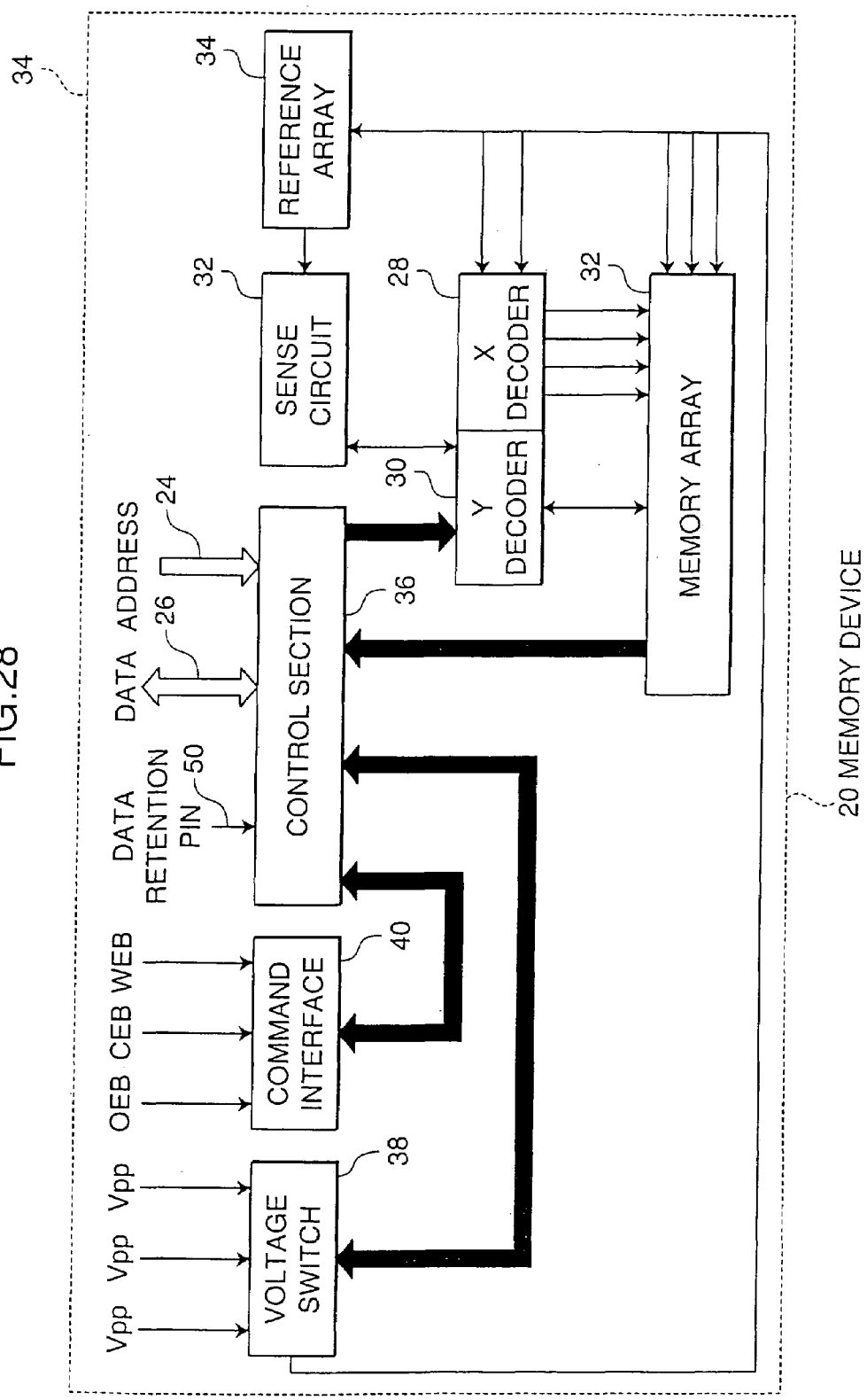
FIG. 28 is a block diagram showing a semiconductor memory device that includes a data retention pin.

FIG. 28 is a block diagram showing a memory device that includes a data retention pin 50. When this pin 50 is asserted, the memory device 20 performs a data retention processing. Alternatively, a data retention command may be written to a command interface 40 of the memory device 20 instead of asserting the pin 50.

According to the assertion of the pin 50 or the writing of the data retention command to the interface 40, the memory 20 device performs the data retention processing. The data retention command may indicate this memory 20 device to allow either a certain block of the memory array 22 or the entire memory array 22 to perform the data retention processing by the same method as a method of determining which can be erased, the certain block in the memory array 22 or the entire memory array 22.

Furthermore, a series of processings may be applied to a multilevel memory cell.

The multilevel memory cell may be programmed so that a level of the multilevel memory cell turns in one of multilevel states.

Figure 29:
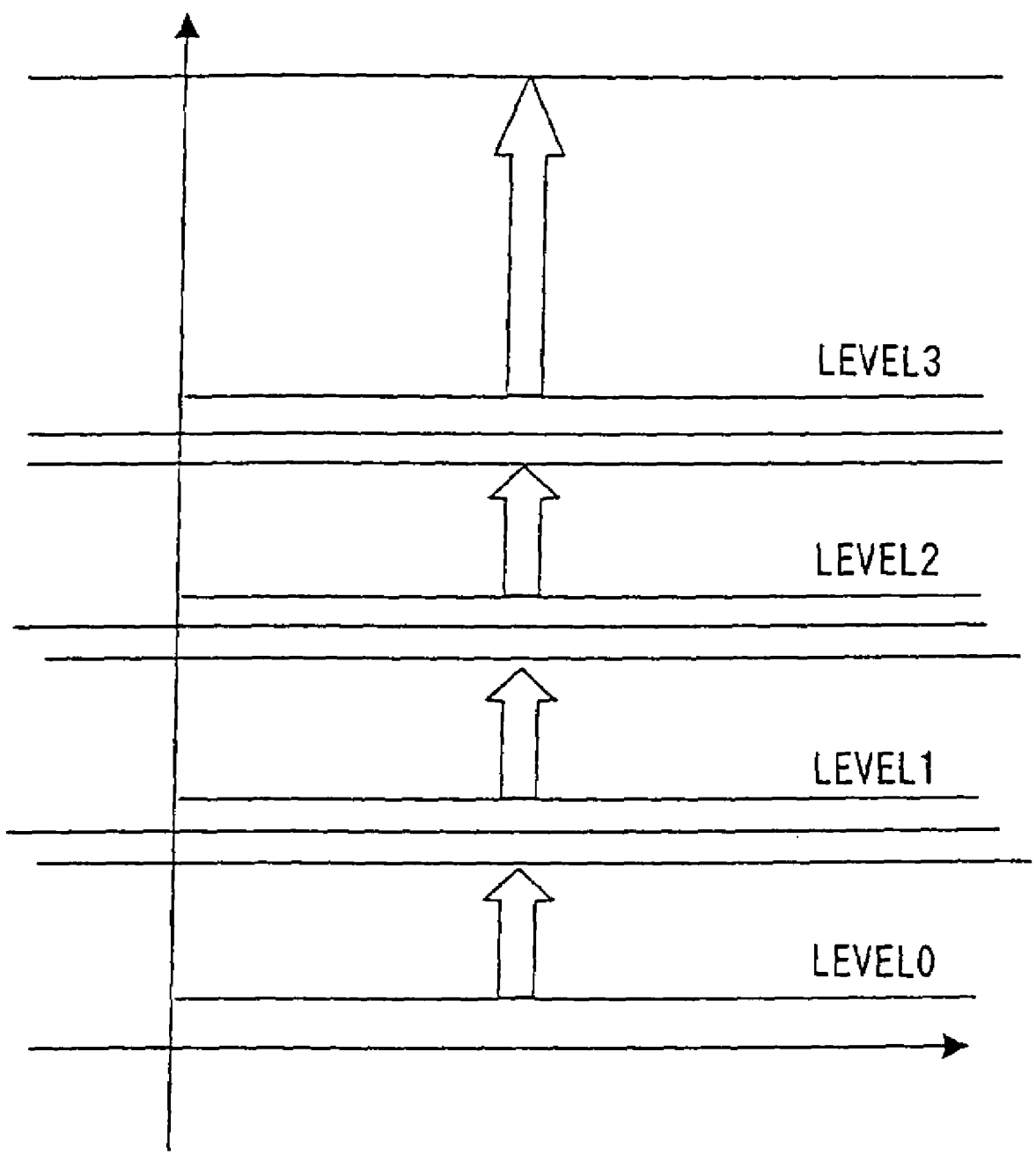
FIG. 29 is a diagram for describing a charge state of a multilevel cell according to an embodiment of the present invention.

FIG. 29 shows a charge state having four multilevel states. Embodiments of the present invention can be used, for example, such that when it is determined that a potential level of charges of the multilevel memory cell is equal to or less than an optimum level, the charges accumulated in the multilevel memory cell are increased. In this case, however, it is necessary to program the accumulated charges so that the memory cell does not turn into a next, higher charge state.

In FIG. 29, the multilevel cell accumulates charges in one of four charge states of level 0 to level 3. Further, buffer regions may be provided to separate the respective charge states from one another. Although different reference levels can be used to extract the voltage Vt in the intermediate region in each charge state, the accumulated charges of each memory cell are increased so that the voltage Vt of the memory cell corresponds to the program region in the same charge state.

Figure 30:
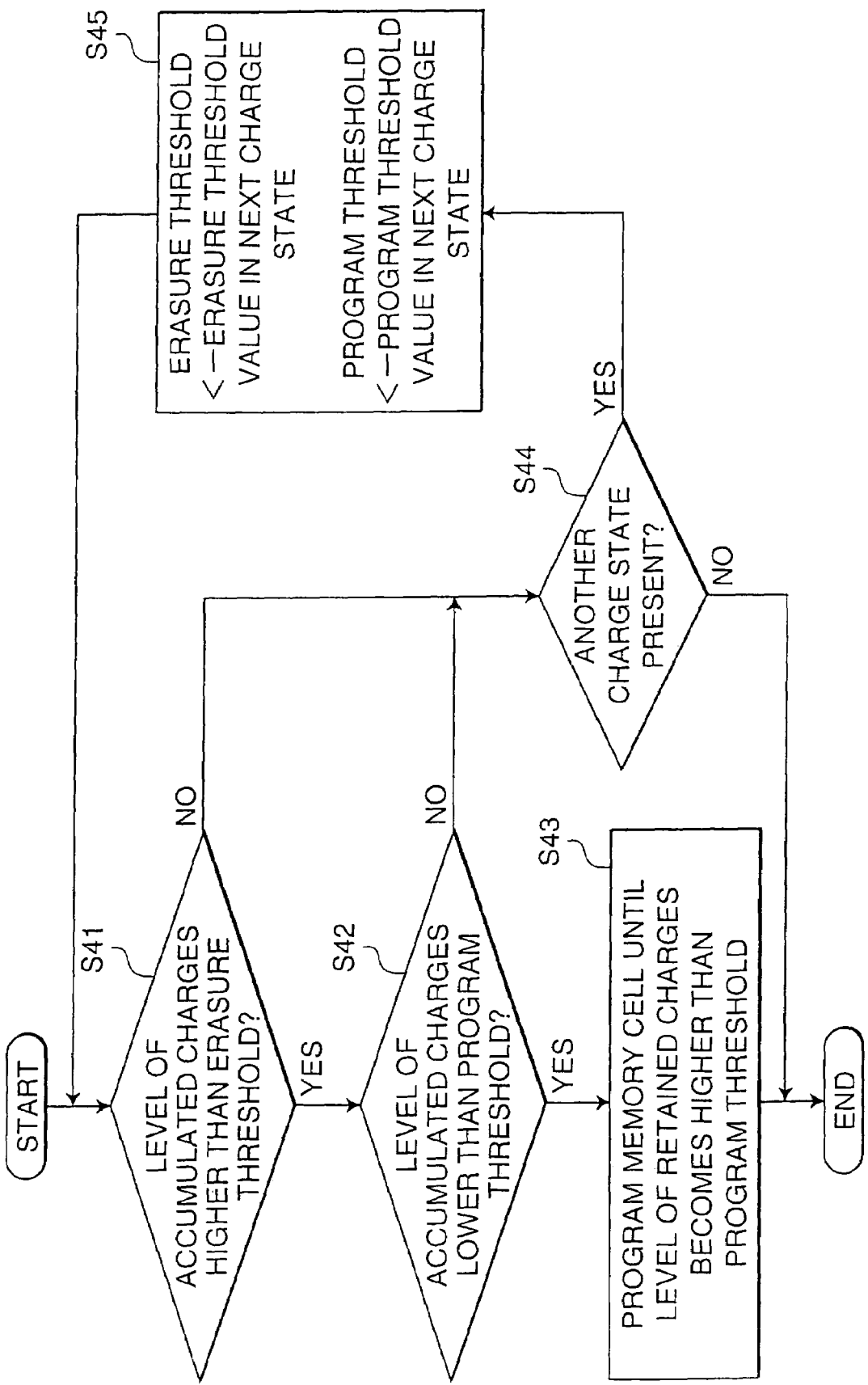
FIG. 30 is a flowchart for describing a series of steps when the data retention processing extends to the multilevel cell.

FIG. 30 is a flowchart for describing a series of steps of the data retention processing performed when the data retention processing extends to the multilevel cell.

In step S41, it is determined whether a certain memory cell retains charges at a level exceeding the erasure threshold that corresponds to the charge state of the multilevel cell. If the memory cell retains charges at the level exceeding the erasure threshold that corresponds to the charge state of the multilevel cell, the processing proceeds to step S42. In step S42, it is determined whether the memory cell retains charges lower in level than the program threshold. If the memory cell retains charges lower in level than the program threshold, the processing proceeds to step S43. In step S43, the memory cell is programmed until the memory cell retains charges higher in level than the program threshold. The processing is then finished.

If it is determined in step S41 that the memory cell does not retain charges at the level exceeding the erasure threshold that corresponds to the charge state of the multilevel cell or in step S42 that the memory cell does not retain charges lower in level than the program threshold, the processing proceeds to step S44. In step S44, if there is another charge state, the processing proceeds to step S45. If there is not another charge state, the processing is finished.

In step S45, the erasure threshold is set at an erasure threshold in the next charge state. In addition, the program threshold is set at a program threshold in the next charge state. For example, levels of the two thresholds may start at levels in the lowest charge state and the levels may be sequentially raised to examine the next, higher charge state. Alternatively, the levels may start at levels in the highest charge state and the levels may be sequentially lowered to examine all charge states. Further, it is often unnecessary to examine some charge states if the thresholds in a certain charge state are compared with those in the previous charge state at necessary.

In another embodiment, the respective levels in each charge state may include the guard band voltage above the erasure threshold shown in FIG. 24. The memory cell having the voltage Vt belonging to a charge state region in which the voltage is higher than the guard band voltage but lower than the program threshold, is programmed so that the charge state is raised to the program threshold. By performing these series of processings, it is possible to improve even the data retention ability of the multilevel cell and to thereby improve reliability.

Eleventh Embodiment

Figure 20:
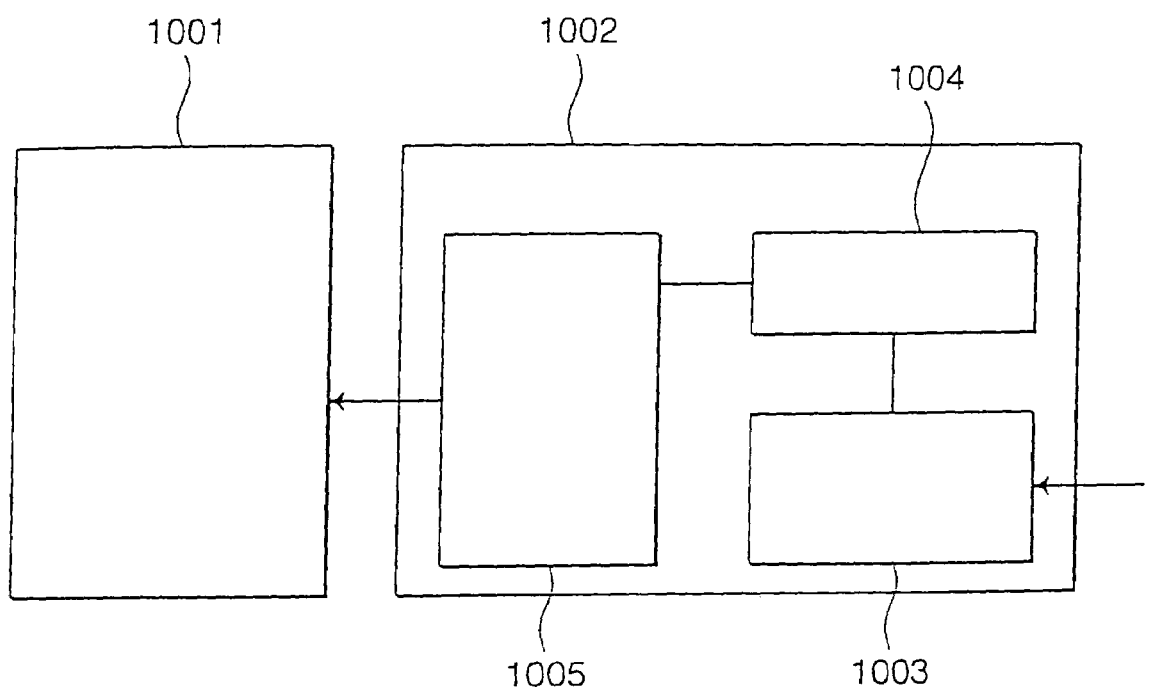
FIG. 20 is a schematic configuration diagram showing a liquid crystal display device (eleventh embodiment) incorporating therein the semiconductor memory device according to an embodiment of the present invention.

As an application example of the semiconductor memory device, for example, as shown in FIG. 20, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the sidewall memory cell of an embodiment of the present invention, more preferably, any of the semiconductor memory devices of the first to ninth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 20 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the sidewall memory cell. Particularly, it is preferable to use any of the semiconductor memory devices of the seventh to ninth embodiments in which sidewall memory cells of embodiments of the present invention are integrated.

By using the sidewall memory cell of embodiments of the present invention as the nonvolatile memory for image adjustment of the liquid crystal panel, a process for forming the sidewall memory cell together with a liquid crystal driver and the like is easy, so that the manufacturing cost can be reduced.

Twelfth Embodiment

Figure 21:
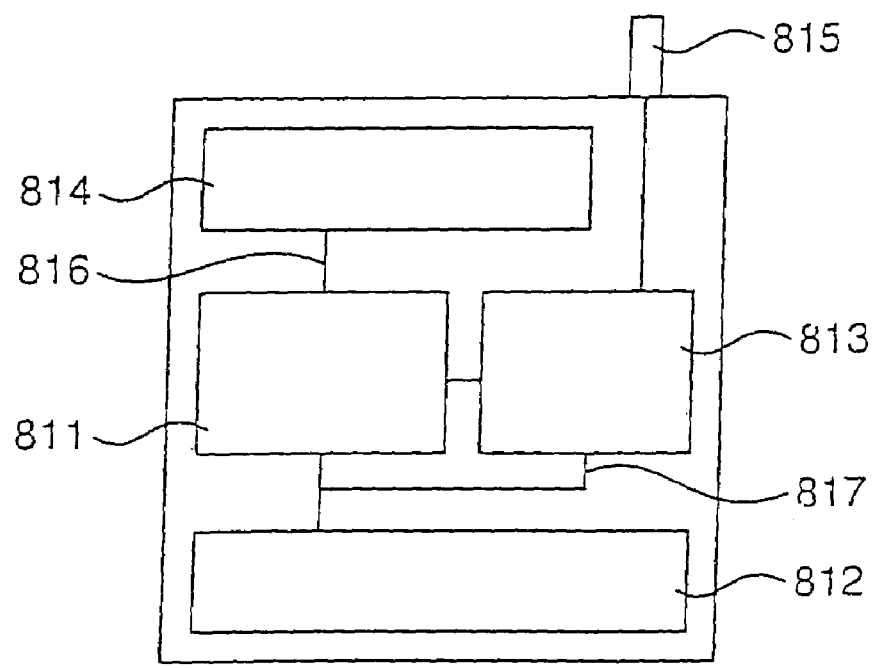
FIG. 21 is a schematic configuration diagram showing a portable electronic apparatus (twelfth embodiment) incorporating therein the semiconductor memory device according to an embodiment of the present invention.

FIG. 21 shows a cellular telephone as a portable electronic apparatus incorporating the above-described semiconductor memory device.

The cellular telephone is mainly constructed by a control circuit 811, a battery 812, an RF (Radio Frequency) circuit 813, a display 814, an antenna 815, a signal line 816 and a power source line 817. The control circuit 811 incorporates therein the above-described semiconductor memory device according to an embodiment of the present invention. Herein, the control circuit 811 is preferably an integrated circuit, in which devices of the same configuration serve as a memory circuit device and a logic circuit device, as described in the tenth embodiment. Consequently, the integrated circuit can be easily fabricated, and thus, the fabrication cost of the portable electronic apparatus can be remarkably reduced.

In this manner, it is possible to increase the operation speed of the portable electronic apparatus and reduce the fabrication cost, so as to provide the inexpensive portable electronic apparatus having high reliability and high performance by using, for the portable electronic apparatus, the semiconductor memory device which facilitates the combination process between a memory and a logic circuit and achieves a reading operation at a high speed.

According to embodiments of the present invention, the level of charges stored in each nonvolatile memory cell is determined and the selected memory cells are programmed. Therefore, even if there is leakage of charges, the data retention ability of each memory device can be improved. It is possible to provide the semiconductor memory device excellent in data retention characteristics and high in reliability, accordingly.

Further, in the nonvolatile memory cell according to embodiments of the present invention, the charge retention film in each memory functional unit is the insulating film. Therefore, the nonvolatile memory cell is strong against charge leakage and excellent in data retention characteristics. In addition, if the nonvolatile memory cell includes the insulating film that isolates the film having the surface substantially parallel to that of the gate insulating film and having the charge retention function from the channel region or the semiconductor layer and the thickness of the insulating film is larger than that of the gate insulating film and is 20 nm or less, the nonvolatile memory cell exhibits more excellent data retention characteristics.

Since each memory functional unit of the memory device according to embodiments of the present invention includes the film having the surface substantially parallel to that of the gate insulating film and having the charge retention function, the change of the characteristics during retention is suppressed.

Since the memory device according to embodiments of the present invention has such excellent charge retention characteristics, it is possible to decrease the frequency of a series of data retention processings for reprogramming a program cell which level has lowered from the program reference level. Besides, the number of cells itself needed to be reprogrammed can be decreased. It is, therefore, possible to decrease power memory device is applied to a battery-driven portable electronic apparatus, in particular, battery duration can be made long.

Furthermore, since the P type high concentration region is provided adjacent to the channel-side N type diffusion region in the nonvolatile memory cell, the memory effect improves. In addition, if the nonvolatile memory cell includes the insulating film that isolates the film having the surface substantially parallel to that of the gate insulating film and having the charge retention function from the channel region or the semiconductor layer and the thickness of the insulating film is smaller than that of the gate insulating film and 0.8 nm or more, the quantity of charges induced by the channel region or well region increases and the memory effect thereby increases.

Since each memory functional unit of the nonvolatile memory cell according to an embodiment of the present invention includes the film having the surface substantially parallel to that of the gate insulating film and having the charge retention function, it is possible to suppress irregularities of the memory effect.

As can be understood, the memory device has the great memory effect and the irregularities of the memory effect are small. Therefore, by combining the memory device with the method of improving the data retention characteristics by the series of data retention processings, it is possible to retain data of two bits or more per memory functional unit and to increase a storage capacity per unit area. It is possible to provide a mass storage capacity semiconductor memory device at low cost, accordingly.

Since the memory device according to embodiments of the present invention separates the memory function pursued by the memory functional units from the transistor operation function pursued by the gate insulating film, it is possible to make the gate insulating film thinner and to suppress a short channel effect without deteriorating the memory function.

Moreover, as compared with an EEPROM, the value of a current carried between the diffusion regions during program greatly changes. This facilitates determining whether the memory device is in a program state or an erasure state, whereby the reliability can be improved.

Besides, the formation process for the memory device according to embodiments of the present invention is quite similar to that for an ordinary transistor. Therefore, as compared with an instance in which the conventional flash memory is employed as the nonvolatile memory cell and the nonvolatile memory cell and the ordinary transistor are mounted on the same substrate, it is possible to considerably decrease the number of masks and the number of processing steps. Accordingly, chip yield is improved, cost reduction is realized, and the memory device high in reliability can be provided at low cost.

Additionally, if an electronic apparatus includes the memory cell according to an embodiment of the present invention, it is possible to accelerate an operating rate of the electronic apparatus, to reduce the manufacturing cost of the electronic apparatus, and to obtain the portable electronic apparatus or display device high in reliability at low cost.

What is claimed is:

1. A method of improving a data retention ability of a semiconductor memory device having; a plurality of nonvolatile memory cells storing a plurality of memory states, the method comprising the steps of:
   (a) selecting from the plurality of nonvolatile memory cells a first memory group of nonvolatile memory cells each of which accumulates charges higher in level than a first threshold;
   (b) selecting from the nonvolatile memory cells in the first memory group a first sub-group of nonvolatile memory cells each of which accumulates charges lower in level than a second threshold; and
   (c) programming the nonvolatile memory cells in the first sub-group until each of the nonvolatile memory cells in the first subgroup accumulates charges higher in level than the second threshold, wherein each of the plurality of nonvolatile memory cells includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

2. The method according to claim 1, wherein
the steps (a) to (c) are executed based on a command written to the semiconductor memory device.

3. The method according to claim 1, wherein
the steps (a) to (c) are executed based on a signal inputted to a pin included in the semiconductor memory device.

4. The method according to claim 1, wherein
the first threshold corresponds to a potential level obtained by adding a guard band level to a reference level of an erasure cell.

5. The method according to claim 1, further comprising the steps of:
   (d) selecting a second memory group of nonvolatile memory cells each of which accumulates charges higher in level than a third threshold;
   (e) selecting from the nonvolatile memory cells in the second memory group a second sub-group of nonvolatile memory cells each of which accumulates charges lower in level than a fourth threshold; and
   (f) programming the nonvolatile memory cells in the second sub-group until each of the nonvolatile memory cells in the second subgroup accumulates charges higher in level than the fourth threshold, wherein
the third threshold is higher than the second threshold, and the fourth threshold is higher than the third threshold.

6. The method according to claim 1, further comprising the steps of:
   (d) selecting a second memory group of nonvolatile memory cells each of which accumulates charges higher in level than a third threshold;
   (e) selecting from the nonvolatile memory cells in the second memory group a second sub-group of nonvolatile memory cells each of which accumulates charges lower in level than a fourth threshold; and
   (f) programming the nonvolatile memory cells in the second sub-group until each of the nonvolatile memory cells in the second sub-group accumulates charges higher in level than the fourth threshold, wherein
the fourth threshold is lower than the first threshold, and the third threshold is lower than the fourth threshold.

7. A method of improving a data retention ability of a semiconductor memory device having nonvolatile memory cells storing a plurality of memory states, the method comprising the steps of, in the case where a first plurality of the nonvolatile memory cells comprises memory cells in an erasing state each of which accumulates charges lower in level than a predetermined erasure reference level and a second plurality of the memory cells in a programming state each of which accumulates the charges higher in level than a predetermined program reference level are present:
   (a) selecting a third plurality of the nonvolatile memory cells each of which accumulates charges higher than the erasure reference level and lower than the program reference level; and (b) programming the selected nonvolatile memory cells until each of the selected nonvolatile memory cells accumulates charges higher than the program reference level, wherein each of the nonvolatile memory cells includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

8. The method according to claim 7, wherein the step (a) of selecting a third plurality of nonvolatile memory cells each of which accumulates charges higher than the erasure reference level and lower than the program reference level comprises the step of selecting a fourth plurality of nonvolatile memory cells higher than a level obtained by adding a guard band level to the erasure reference level are selected, and the guard band level is between 300 mV and 500 mV.

9. A method of improving a data retention ability of a semiconductor memory device having nonvolatile memory cells storing a plurality of memory states, the method comprising the steps of, in the case where a first plurality of the nonvolatile memory cells comprises nonvolatile memory cells in an erasing state each of which accumulates charges lower in level than a predetermined erasure reference level and a second plurality of memory cells in a programming state each of which accumulates charges higher in level than a predetermined program reference level are present:

(a) reading first data from a certain nonvolatile memory cell group using a reference voltage level corresponding to the program reference level;

(b) reading second data from the certain nonvolatile memory cell group using a reference voltage level corresponding to a level obtained by adding a guard band level to the erasure reference level;

(c) comparing the first data obtained in the step (a) with the second data obtained in the step (b); and (d) programming at least one nonvolatile memory cell group corresponding to a difference between the first data and the second data, wherein each of the nonvolatile memory cells includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

10. The method according to claim 9, wherein the step (b) is executed before the step (a).

11. A semiconductor memory device comprising a pin for receiving a data retention signal for programming a nonvolatile memory cell that accumulates charges belonging to an intermediate charge region higher than an erasure cell threshold and lower than a program threshold, wherein the nonvolatile memory cell includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

12. The semiconductor memory device according to claim 11, further comprising: a buffer region for separating the erasure cell threshold from the intermediate charge region.

13. The semiconductor memory device according to claim 11, further comprising:

a command register for receiving commands including a data retention command for programming the nonvolatile memory cell which accumulates the charges belonging to the intermediate charge region.

14. A semiconductor memory device comprising:

a memory array;

a command register constituted to receive a data retention command for performing a data retention processing including a step of programming a nonvolatile memory cell that accumulates charges belonging to an intermediate charge region between an erasing state and a programming state; and a memory array control circuit executing the data retention processing to the memory array in response to the data retention command, wherein the memory array includes a plurality of nonvolatile memory cells storing a plurality of memory states, and each of the nonvolatile memory cell includes a gate electrode formed on a semiconductor layer via a gate insulating film, a channel region disposed under the gate electrode, diffusion regions disposed on both sides of the channel regions and having a conductive type opposite to that of the channel region, and memory functional units formed on both sides of the gate electrode and having the function of retaining charges.

15. The method according to claim 1, wherein a charge retention film in the memory functional unit in the nonvolatile memory cell is an insulating film.

16. The semiconductor memory device according to claim 11, wherein a charge retention film in the memory functional unit in the nonvolatile memory cell is an insulating film.

17. The method according to claim 1, wherein the nonvolatile memory cell includes a film having a surface substantially parallel to the surface of the gate insulating film and the function of retaining charges, and an insulating film for separating the film from the channel region or the semiconductor layer, and the insulating film is thicker than the gate insulating film and is 20 nm or less.

18. The semiconductor memory device according to claim 11, wherein the nonvolatile memory cell includes a film having a surface substantially parallel to the surface of the gate insulating film and the function of retaining charges, and an insulating film for separating the film from the channel region or the semiconductor layer, and the insulating film is thicker than the gate insulating film and is 20 nm or less.

19. The method according to claim 1, wherein the memory functional unit of the nonvolatile memory cell includes a film having a surface substantially parallel to the surface of the gate insulating film and the function of retaining charges.

20. The semiconductor memory device according to claim 11, wherein the memory functional unit of the nonvolatile memory cell includes a film having a surface substantially parallel to the surface of the gate insulating film and the function of retaining charges.

21. The method according to claim 1, wherein a region of a higher concentration than that of a region in the vicinity of the surface of the semiconductor layer under the gate electrode is provided in the vicinity of the diffusion region of the nonvolatile memory cell.

22. The semiconductor memory device according to claim 11, wherein a region of a higher concentration than that of a region in the vicinity of the surface of the semiconductor layer under the gate electrode is provided in the vicinity of the diffusion region of the nonvolatile memory cell.

23. The method according to claim 1, wherein the nonvolatile memory cell includes a film having a surface substantially parallel to the surface of the gate insulating film and the function of retaining charges, and an insulating film for separating the film from the channel region or the semiconductor layer, and the insulating film is thinner than the gate insulating film and is 0.8 nm or more.

24. The semiconductor memory device according to claim 11, wherein the nonvolatile memory cell includes a film having a surface substantially parallel to the surface of the gate insulating film and the function of retaining charges, and an insulating film for separating the film from the channel region or the semiconductor layer, and the insulating film is thinner than the gate insulating film and is 0.8 nm or more.

25. A portable electronic apparatus comprising a semiconductor memory device a data retention ability of which is improved by the method according to claim 1.

26. A portable electronic apparatus comprising the semiconductor memory device according to claim 11.

* * * * *